US012380024B2

United States Patent
Mun et al.

(10) Patent No.: US 12,380,024 B2
(45) Date of Patent: Aug. 5, 2025

(54) MEMORY DEVICE, OPERATING METHOD OF MEMORY DEVICE, AND STORAGE DEVICE

(71) Applicant: SK hynix Inc., Icheon-si (KR)

(72) Inventors: Ji Seong Mun, Icheon-si (KR); Chan Keun Kwon, Icheon-si (KR); Ja Yoon Goo, Icheon-si (KR); Hyeon Cheon Seol, Icheon-si (KR); Sung Hwa Ok, Icheon-si (KR); Young Seung Yoo, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/417,840

(22) Filed: Jan. 19, 2024

(65) Prior Publication Data

US 2025/0077425 A1   Mar. 6, 2025

(30) Foreign Application Priority Data

Aug. 28, 2023  (KR) .................. 10-2023-0112889

(51) Int. Cl.
*G06F 12/0802* (2016.01)
(52) U.S. Cl.
CPC .. *G06F 12/0802* (2013.01); *G06F 2212/1044* (2013.01); *G06F 2212/401* (2013.01)
(58) Field of Classification Search
CPC ......... G06F 12/0802; G06F 2212/1044; G06F 2212/401
See application file for complete search history.

(56) References Cited

U.S. PATENT DOCUMENTS

| | | | | |
|---|---|---|---|---|
| 2006/0090108 A1* | 4/2006 | Seyyedy | ............... | G11C 29/40 714/718 |
| 2013/0201769 A1* | 8/2013 | Yang | ..................... | G11C 16/32 365/189.011 |
| 2013/0315007 A1* | 11/2013 | Cha | ........................ | G11C 29/40 365/189.07 |

(Continued)

FOREIGN PATENT DOCUMENTS

| | | |
|---|---|---|
| KR | 1020090047975 A | 5/2009 |
| KR | 1020110002678 A | 1/2011 |
| KR | 1020160143014 A | 12/2016 |

*Primary Examiner* — Michael Krofcheck
(74) *Attorney, Agent, or Firm* — WILLIAM PARK & ASSOCIATES LTD.

(57) ABSTRACT

A memory device includes a plurality of memory planes, each including a plurality of memory banks; one or more plane groups, each comprising at least two memory planes sharing at least one peripheral circuit; a plurality of compressing circuits, each connected to a corresponding memory bank and outputting compressed data by compressing data read from the corresponding memory bank; a plurality of merge circuits, each receiving compressed data and at least one output control signal corresponding to a merge group of a plurality of merge groups, each merge circuit outputting, in response to at least one output control signal, merged data obtained by merging compressed data corresponding to memory banks grouped in the merge group; and an output buffer circuit latching and outputting the merged data in response to at least one output control signal. The merge group comprises at least two memory banks in a same plane group.

20 Claims, 13 Drawing Sheets

(56) References Cited

U.S. PATENT DOCUMENTS

| | | | |
|---|---|---|---|
| 2014/0133235 A1* | 5/2014 | Kim | G11C 8/08 |
| | | | 365/185.12 |
| 2021/0117335 A1* | 4/2021 | Kondo | G11C 16/0483 |
| 2022/0343993 A1 | 10/2022 | Gadamsetty | |
| 2025/0054526 A1 | 2/2025 | Kwon et al. | |

* cited by examiner

MEMORY DEVICE, OPERATING METHOD OF MEMORY DEVICE, AND STORAGE DEVICE

CROSS-REFERENCE TO RELATED APPLICATION

The present application claims priority under 35 U.S.C. § 119(a) to Korean patent application number 10-2023-0112889 filed on Aug. 28, 2023, in the Korean Intellectual Property Office, the entire disclosure of which is incorporated herein by reference.

BACKGROUND

1. Technical Field

The present disclosure generally relates to a memory device, an operating method of a memory device, and a storage device.

2. Related Art

Data read in a memory device may be transferred to an input/output pad through a data line. The number or quantity of data lines may be fixed to a predetermined quantity because of physical limitations. In general, a plurality of memory areas (memory banks) included in a plurality of memory devices or one memory device may share and use a fixed quantity of data lines.

In general, an operation including sharing and using data lines may indicate an operation in which a plurality of memory areas included in a plurality of memory devices or one memory device use a fixed quantity of data lines in a set order by a set time through time division multiplexing or time sharing.

SUMMARY

In accordance with an embodiment of the present disclosure, a memory device includes: a plurality of memory planes, each including a plurality of memory banks; one or more plane groups, each plane group comprising at least two memory planes sharing at least one peripheral circuit; a plurality of compressing circuits, wherein each compressing circuit is connected to a corresponding memory bank of the plurality of memory banks and outputs compressed data by compressing data read from the corresponding memory bank of the plurality of memory banks in a compression read operation; a plurality of merge circuits, each merge circuit receiving compressed data and at least one of a plurality of output control signals corresponding to a merge group of a plurality of merge groups, each merge circuit outputting, in response to at least one of the plurality of output control signals, merged data obtained by merging compressed data corresponding to memory banks grouped in the merge group; and an output buffer circuit latching the merged data and outputting the merged data in response to at least one of the plurality of output control signals; wherein the merge group comprises at least two memory banks included in a same plane group.

In accordance with another embodiment of the present disclosure, a method of operating a memory device includes: generating compressed data obtained by compressing data read from a plurality of memory banks included in each of a plurality of memory planes; merging compressed data corresponding to memory banks grouped as a merge group in response to at least one of a plurality of output control signals corresponding to at least one of the memory banks; and outputting the merged data in response to the at least one of the plurality of output control signal, wherein the plurality of memory planes are grouped into memory plane groups, wherein each memory plane group comprises at least two memory planes sharing at least one peripheral circuit, and wherein, the merge group comprises at least some of memory banks included in a same plane group.

In accordance with still another embodiment of the present disclosure, a storage device includes: a memory device; and a memory controller configured to provide the memory device with a read command for requesting data to be read; wherein the memory device includes: a plurality of memory planes, each including a plurality of memory banks; one or more plane groups, each plane group comprising at least two memory planes sharing at least one peripheral circuit; a plurality of compressing circuits, wherein each compressing circuit is connected to a corresponding memory bank of the plurality of memory banks and outputs compressed data by compressing data read from the plurality of memory banks in a compression read operation; a plurality of merge circuits, each merge circuit receiving compressed data and at least one of a plurality of output control signals corresponding to a merge group of a plurality of merge groups, each merge circuit outputting, in response to at least one of the plurality of output control signals, merged data obtained by merging compressed data corresponding to memory banks grouped in the merge group; and an output buffer circuit latching the merged data and outputting the merged data in response to at least one of the plurality of output control signals; and wherein the merge group comprises at least some memory banks included in a same plane group.

In accordance with an embodiment of the present disclosure, a memory device includes: a plurality of memory planes, each including a plurality of memory banks; a first plane group comprising at least two memory planes sharing at least one peripheral circuit; a first compressing circuit connected to a first memory bank of the plurality of memory banks and configured to output first compressed data by compressing data read from the first memory bank, wherein the first memory bank is in a first merge group; a second compressing circuit connected to a second memory bank of the plurality of memory banks and configured to output second compressed data by compressing data read from the second memory bank, wherein the second memory bank is in the first merge group; a first merge circuit, corresponding to the first merge group and receiving the first compressed data, the second compressed data, and at least one of a plurality of output control signals, the first merge circuit outputting, in response to at least one of the plurality of output control signals, first merged data obtained by merging the first compressed data and the second compressed data; and an output buffer circuit latching the first merged data and outputting the first merged data in response to at least one of the plurality of output control signals, wherein the first merge group comprises at least some memory banks included in the first plane group.

BRIEF DESCRIPTION OF THE DRAWINGS

Example embodiments are described more fully hereinafter with reference to the accompanying drawings, which may be embodied in different forms and should not be construed as limited to the embodiments set forth herein.

Rather, these embodiments are provided such that this disclosure conveys the scope of the example embodiments to those skilled in the art.

Figure 1:
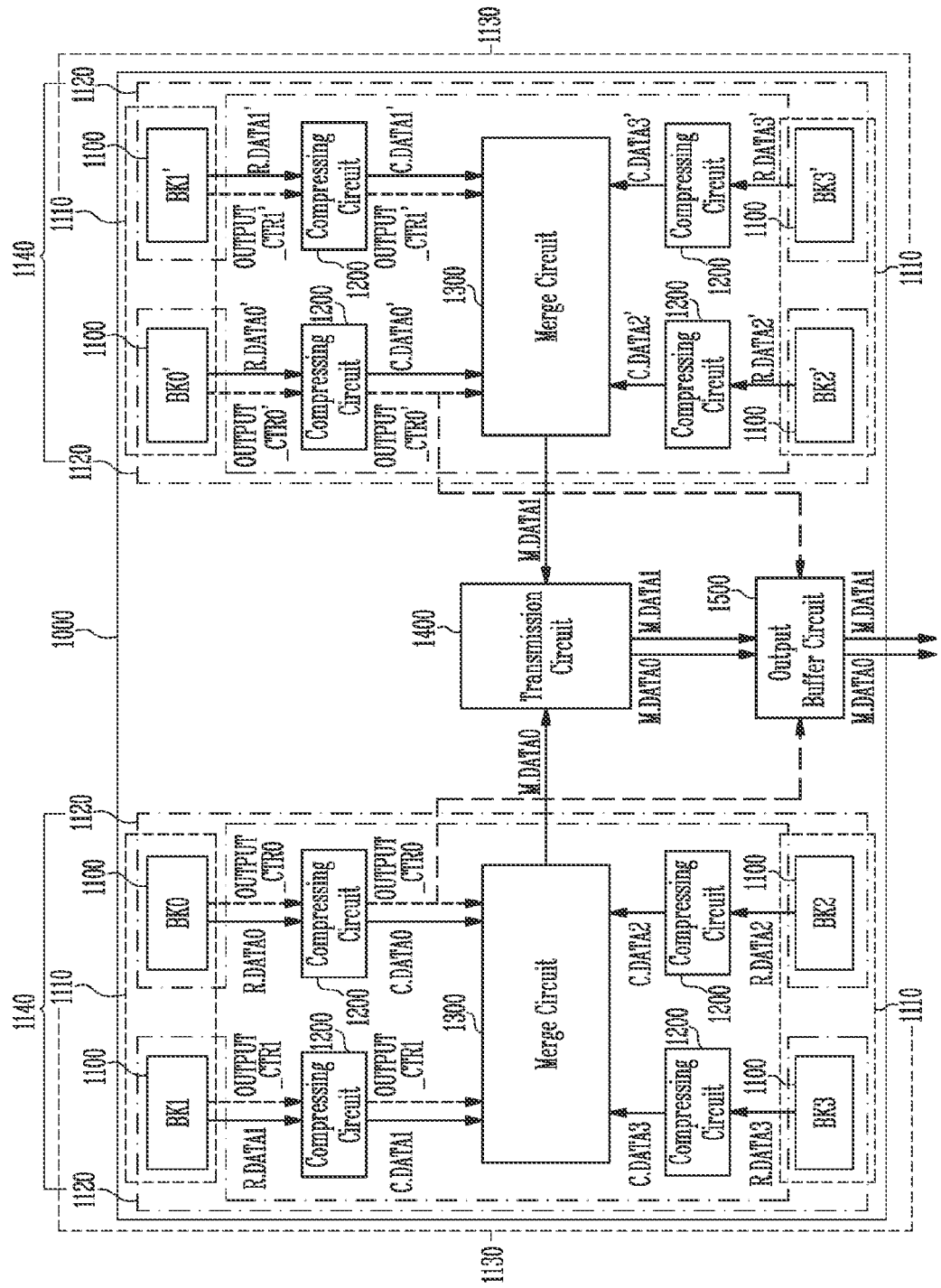

In the drawing figures, dimensions may be exaggerated or imprecise for ease of illustration. When an element is referred to as "between" two elements, such an element may be the only element between the two elements, or one or more intervening elements may also be present between the two elements. Like reference numerals refer to like elements throughout.

FIG. 1 is a block diagram illustrating a memory device in accordance with an embodiment of the present disclosure.

Figure 2:
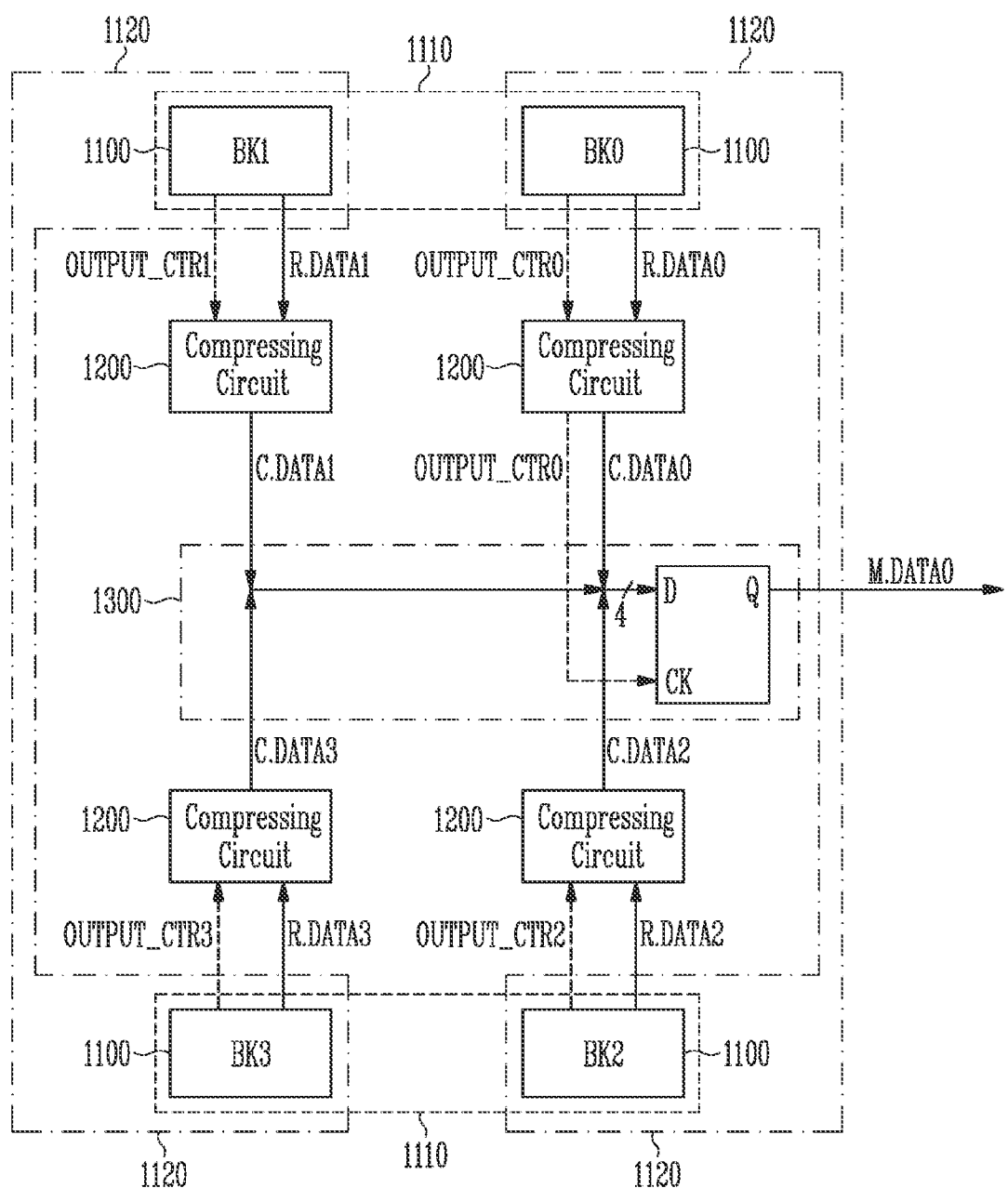

FIG. 2 is a diagram illustrating a merge circuit, such as shown in FIG. 1, in accordance with an embodiment of the present disclosure.

Figure 3:
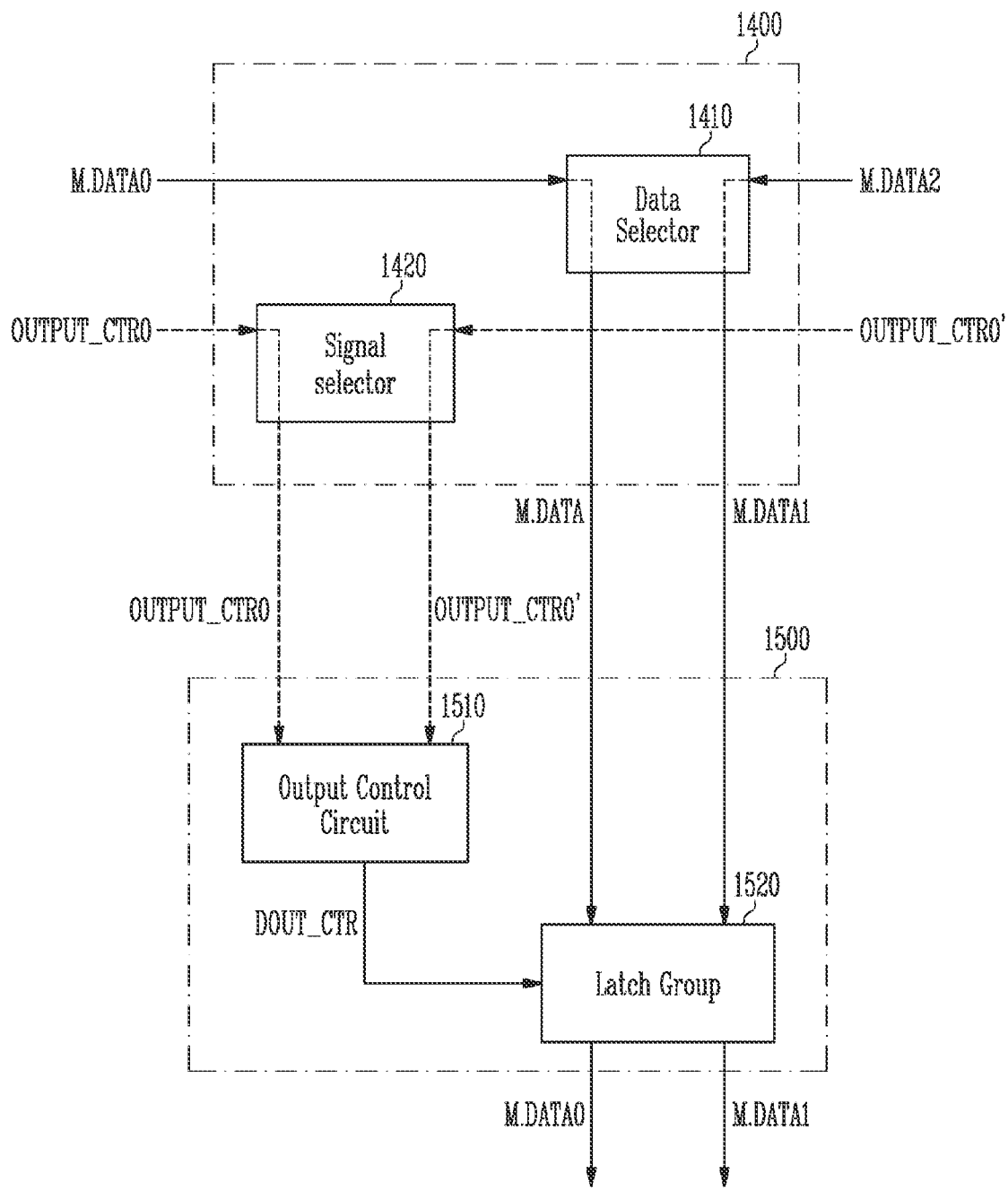

FIG. 3 is a diagram illustrating a transmission circuit and an output buffer circuit, such as shown in FIG. 1, in accordance with an embodiment of the present disclosure.

Figure 4:
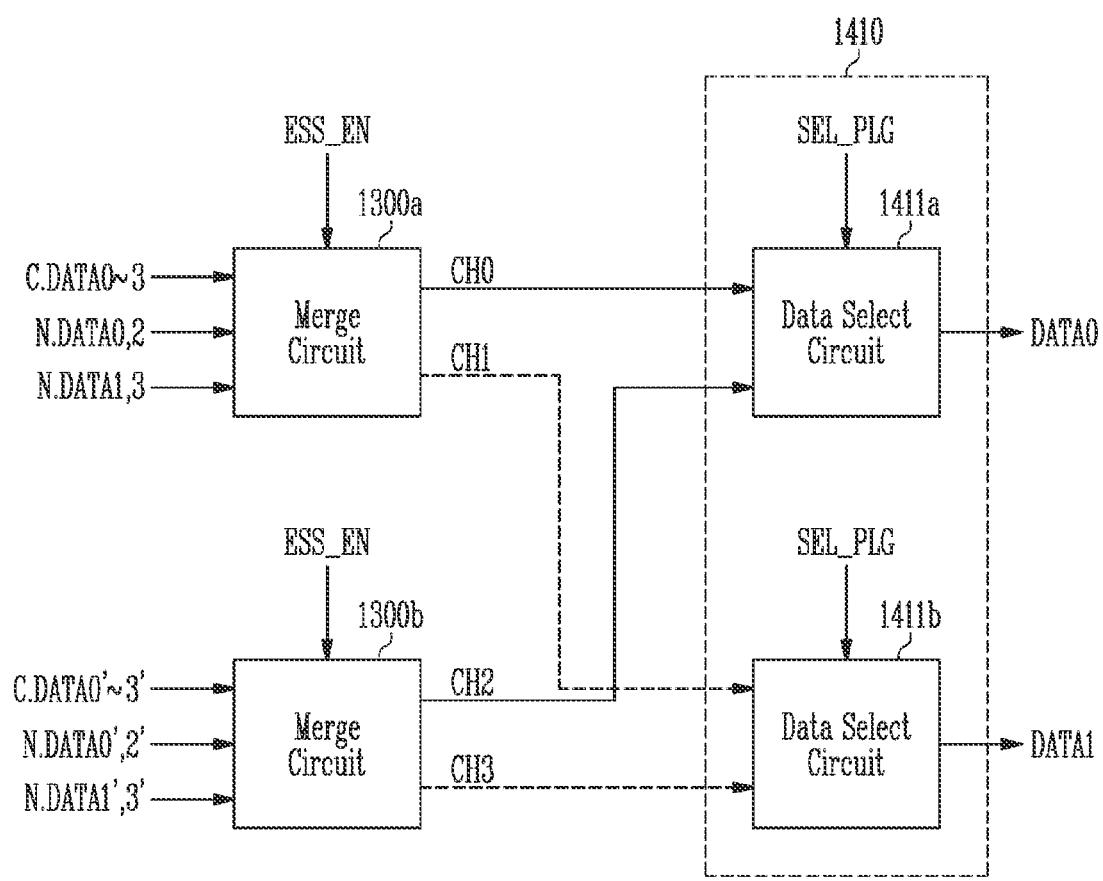

FIG. 4 is a diagram illustrating the merge circuit and the transmission circuit, such as shown in FIG. 1, in accordance with an embodiment of the present disclosure.

Figure 5:
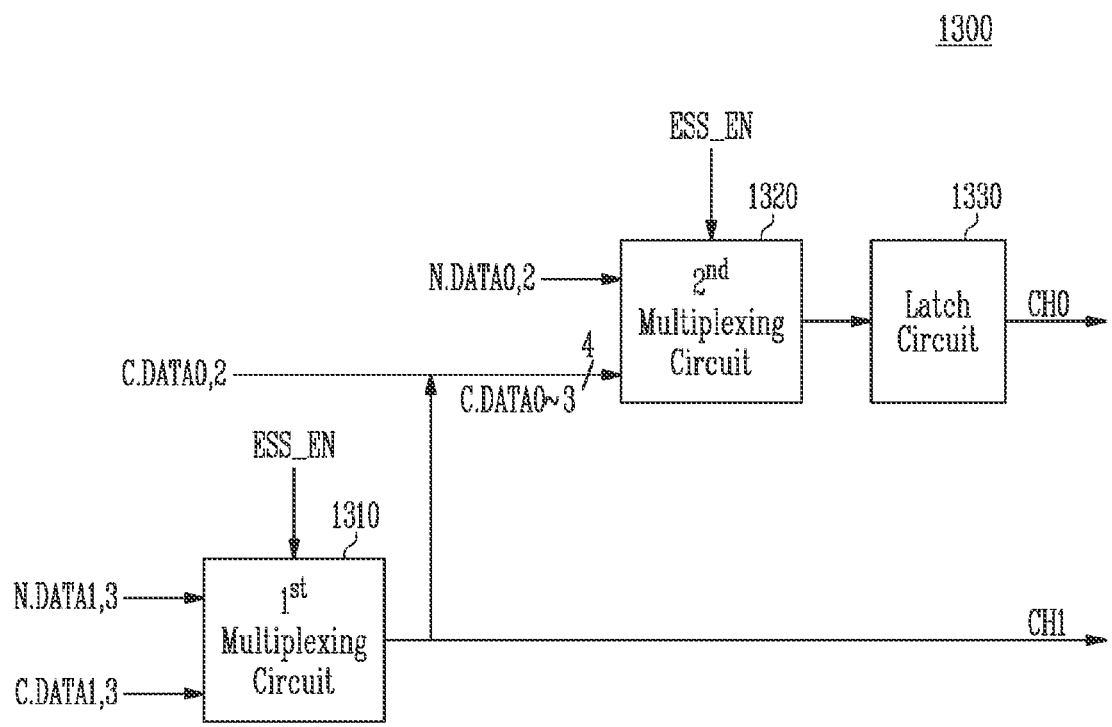

FIG. 5 is a diagram illustrating an embodiment of the merge circuit, such as shown in FIG. 4, in accordance with an embodiment of the present disclosure.

Figure 6:
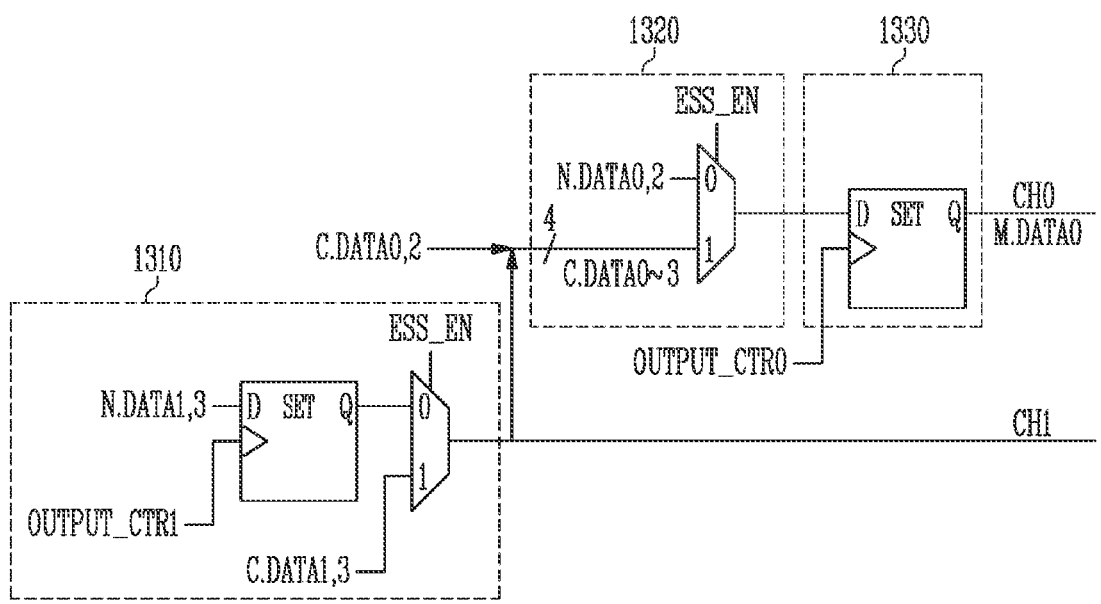

FIG. 6 is a diagram illustrating an example implementation of the merge circuit, such as shown in FIG. 5, in accordance with an embodiment of the present disclosure.

Figure 7:
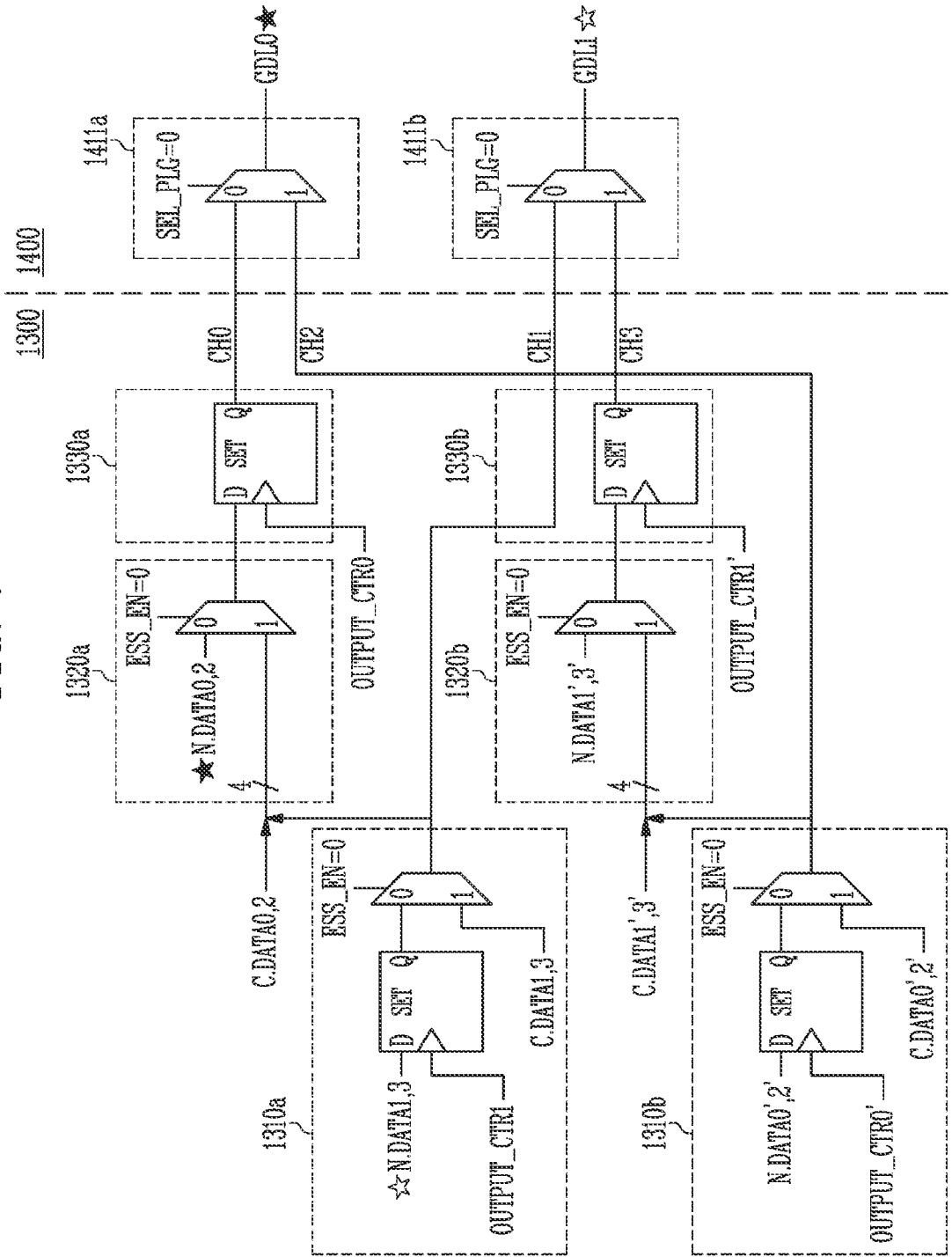

FIG. 7 is a diagram illustrating the merge circuit and the transmission circuit, such as shown in FIG. 4, during a normal read operation in accordance with an embodiment of the present disclosure.

Figure 8:
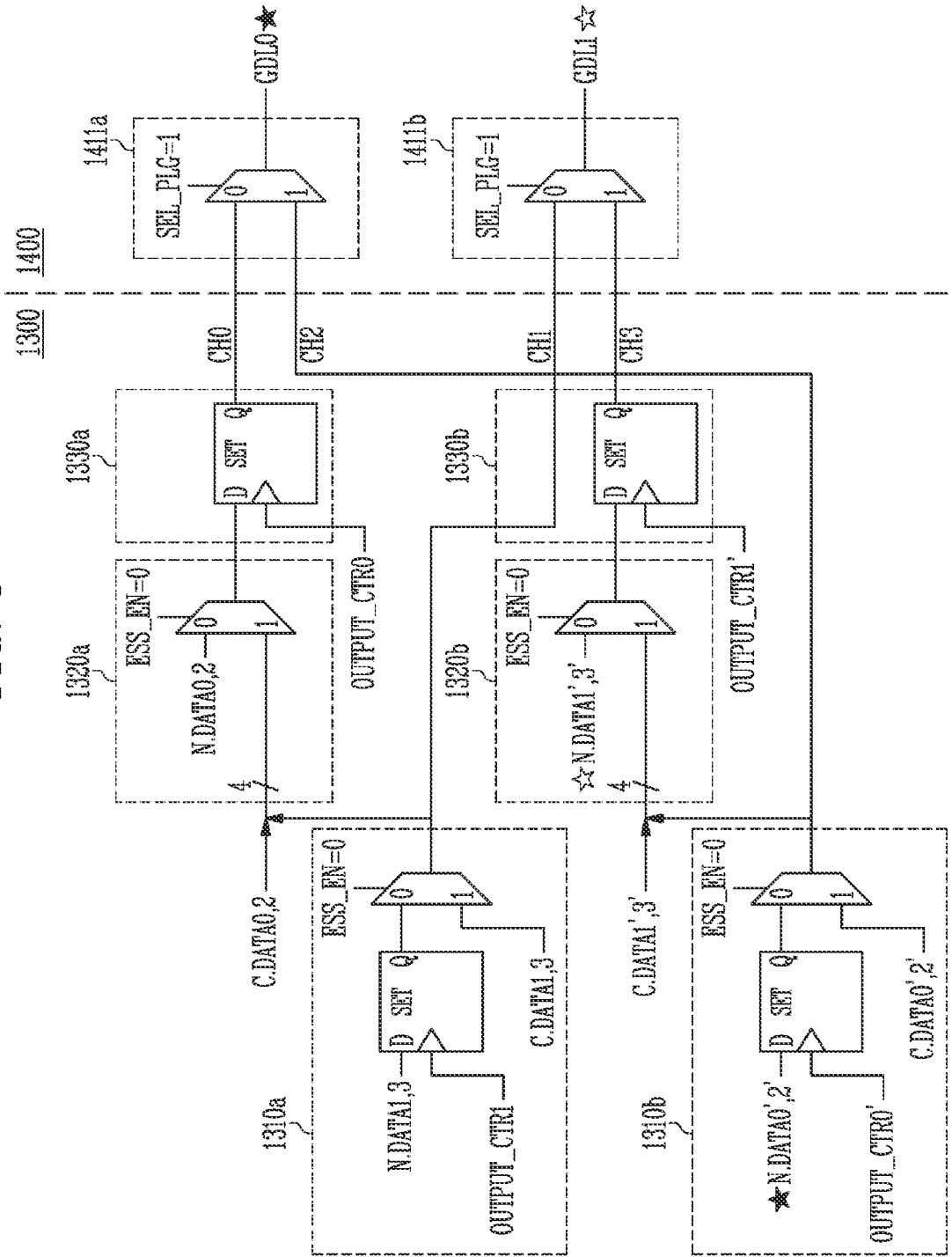

FIG. 8 is a diagram illustrating the merge circuit and the transmission circuit, such as shown in FIG. 4, during a normal read operation in accordance with another embodiment of the present disclosure.

Figure 9:
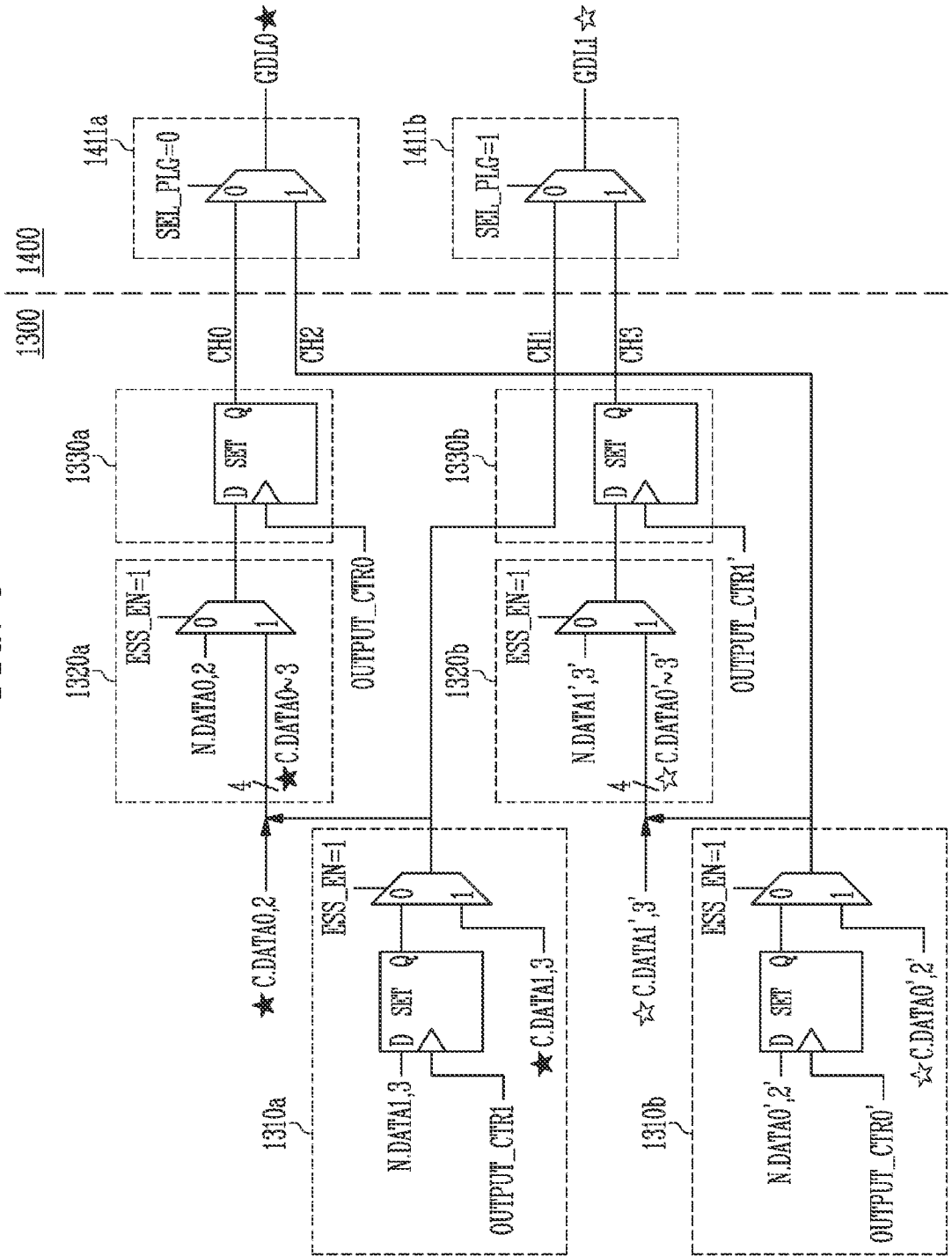

FIG. 9 is a diagram illustrating the merge circuit and the transmission circuit, such as shown in FIG. 4, during a compression read operation in accordance with an embodiment of the present disclosure.

Figure 10:
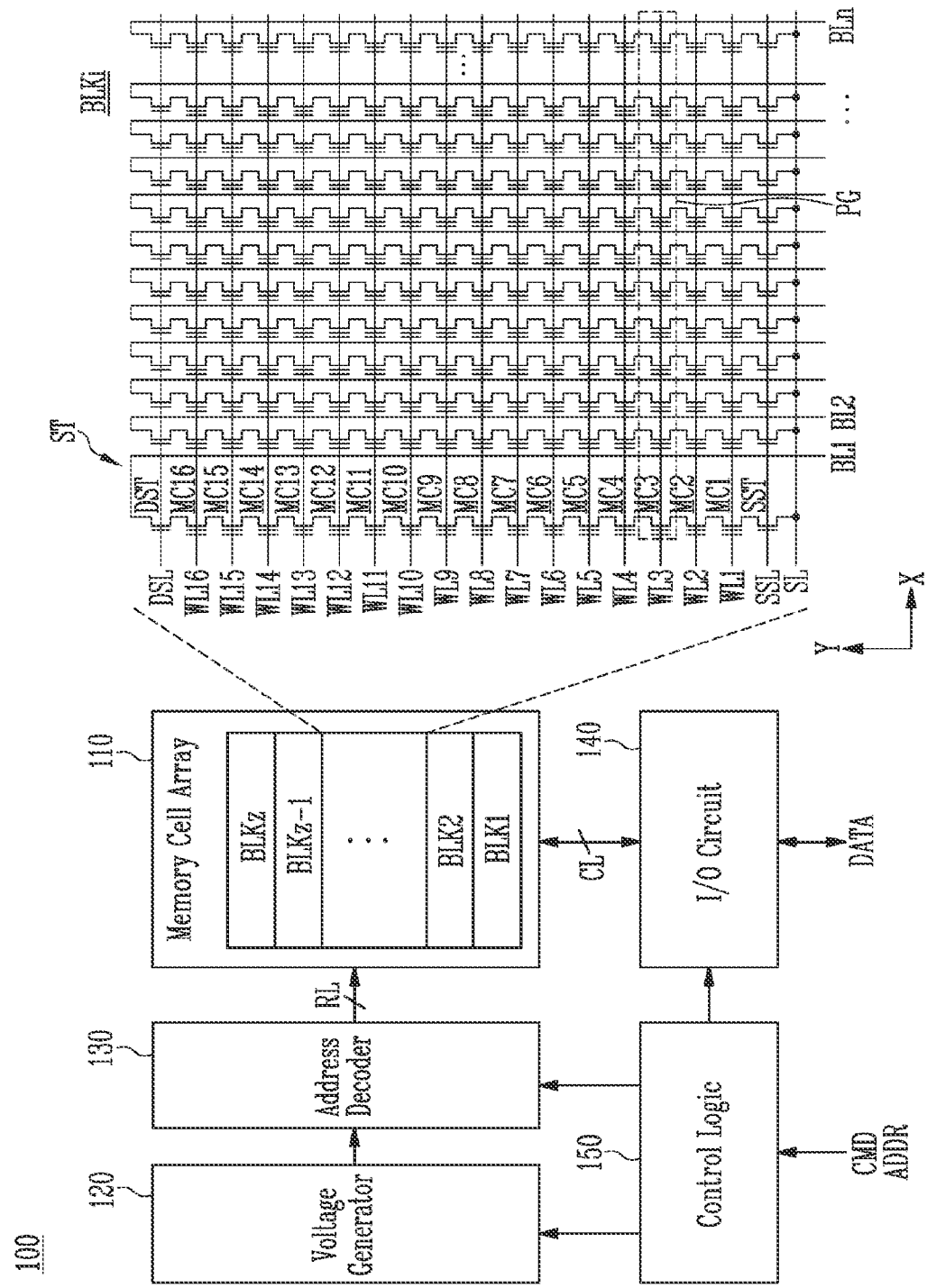

FIG. 10 is a block diagram illustrating another embodiment of a memory controller shown in FIG. 1 in accordance with the present disclosure.

Figure 11:
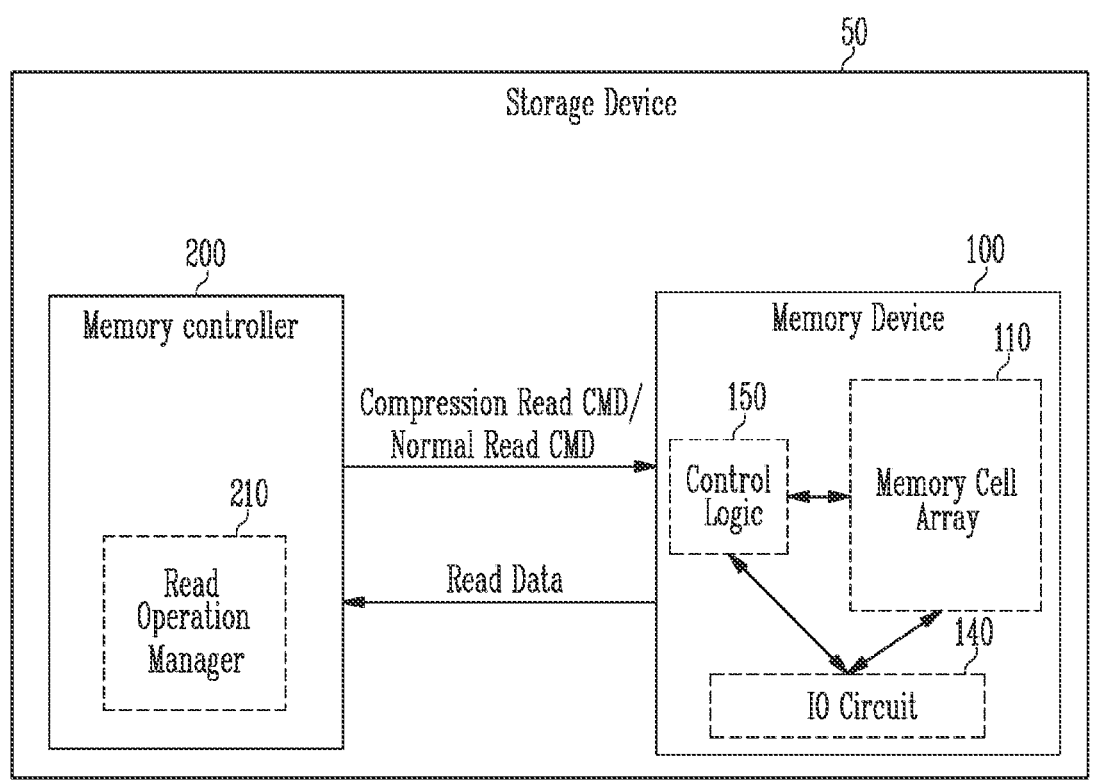

FIG. 11 is a block diagram illustrating a storage device in accordance with an embodiment of the present disclosure.

Figure 12:
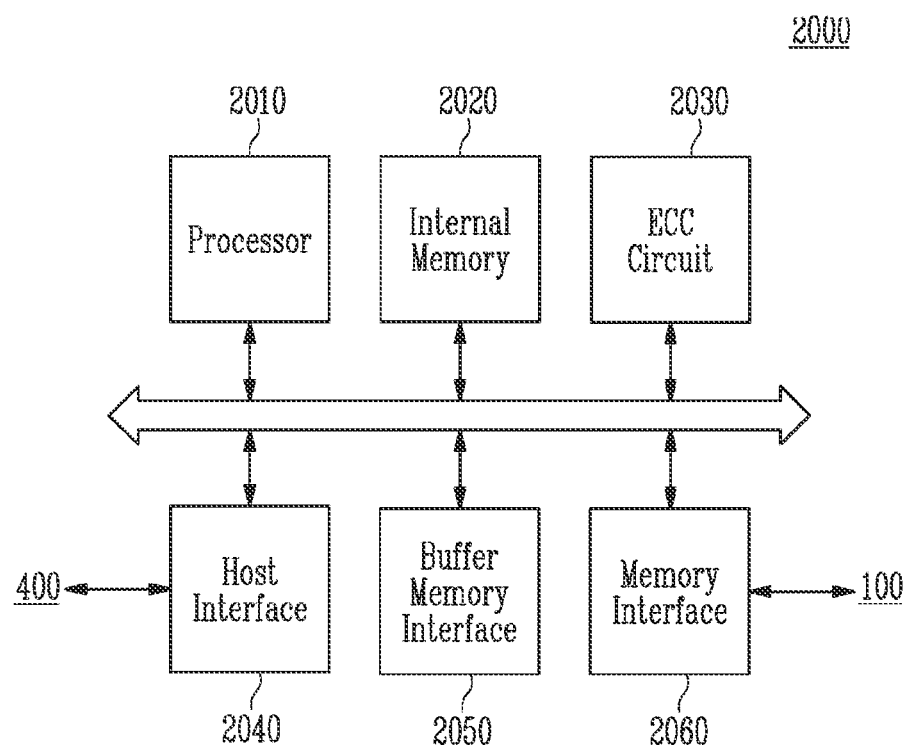

FIG. 12 is a diagram illustrating another embodiment of a memory controller shown in FIG. 11 in accordance with the present disclosure.

Figure 13:
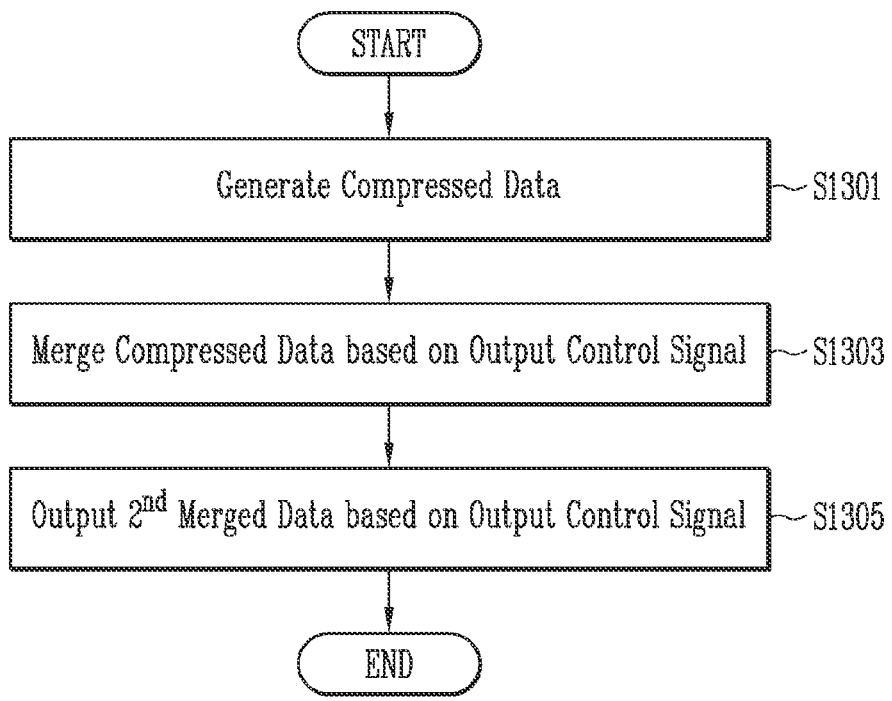

FIG. 13 is a flowchart illustrating an operating method of a memory device in accordance with an embodiment of the present disclosure.

Figure 14:
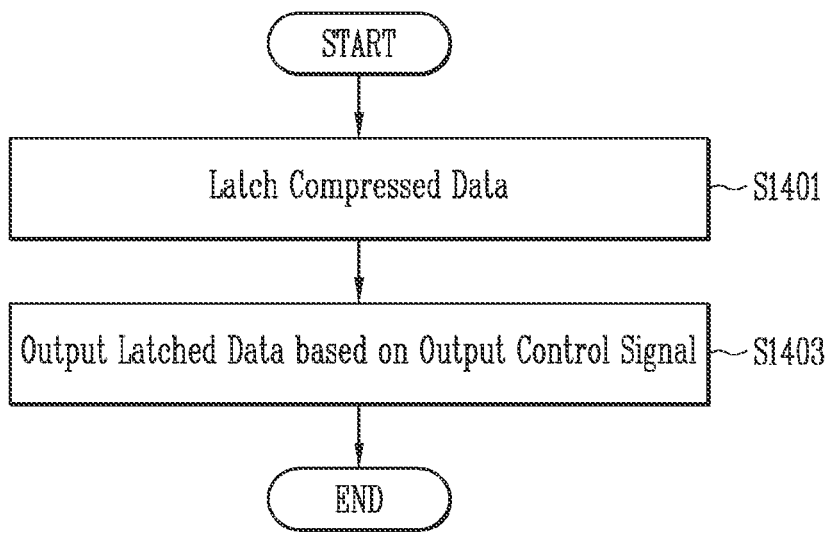

FIG. 14 is a flowchart illustrating details for FIG. 13 in accordance with an embodiment of the present disclosure.

Figure 15:
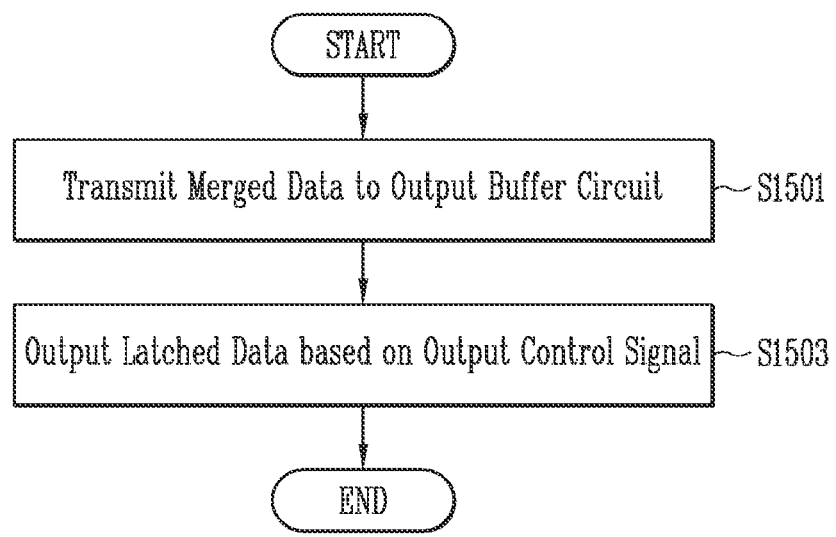

FIG. 15 is a flowchart illustrating details for FIG. 13 in accordance with an embodiment of the present disclosure.

DETAILED DESCRIPTION

The specific structural or functional description disclosed herein is merely illustrative for the purpose of describing embodiments according to the concepts of the present disclosure. The embodiments according to the concepts of the present disclosure can be implemented in various forms and cannot be construed as limited to the embodiments set forth herein.

Embodiments provide a memory device capable of reducing or preventing a merge failure that may occur in a merging process of data when a compression read operation is performed while having a relatively simple structure, an operating method of a memory device, and a storage device.

In an operation mode such as a compression read operation, data read in each of a plurality of memory areas included in a plurality of memory devices or one memory device may be compressed and output, and the plurality of memory areas included in the plurality of memory devices or the one memory device may use a known quantity of data lines obtained by dividing a fixed quantity of data lines for each of the plurality of memory areas. Accordingly, the plurality of memory areas included in the plurality of memory devices or the one memory device may be simultaneously used. For example, when data read in each of four memory devices is compressed by ¼ and the compressed data is output, each of the four memory devices uses two data lines obtained by dividing eight data lines for each of the four memory devices. As a result, the four memory devices may be simultaneously used.

FIG. 1 is a block diagram illustrating a memory device in accordance with an embodiment of the present disclosure.

Referring to FIG. 1, the memory device 1000 includes a plurality of memory banks 1100. Each of the memory banks 1100 includes a plurality of memory blocks. Each of the plurality of memory blocks may include a plurality of memory cells. In an embodiment, the plurality of memory cells may be nonvolatile memory cells. Memory cells connected to the same word line may be described as one page. Therefore, one memory block may include a plurality of pages.

In an embodiment, the memory banks 1100 may be memory areas included in different memory devices, respectively. In another embodiment, the memory banks 1100 may be different memory areas divided in one memory device.

In FIG. 1, eight (8) memory banks 1100 BK0 to BK3 and BK0' to BK3' are included in the memory device 1000. The quantity of memory banks 1100 is not limited to eight. For example, the quantity of memory banks 1100 may be two or more and be smaller or greater than the 8 shown in FIG. 1. In another example, the quantity of memory banks 1100 may be 16 or 32.

In an embodiment, a plurality of memory banks 1100 are included in a memory plane 1110. For example, memory bank 0 and memory bank 1 BK0 and BK1 may be included in a zeroth memory plane, memory bank 2 and memory bank 3 BK2 and BK3 may be included in a first memory plane, memory bank 0' and memory bank 1' BK0' and BK1' may be included in a second memory plane, and memory bank 2' and memory bank 3' BK2' and BK3' may be included in a third memory plane.

Among the memory planes 1110, memory planes 1110 sharing at least one peripheral circuit are grouped to constitute at least one plane group 1130. For example, the zeroth memory plane 1110 including the memory bank 0 and the memory bank 1 BK0 and BK1 and the first memory plane 1110 including the memory bank 2 and the memory bank 3 BK2 and BK3 share a peripheral circuit, and accordingly, the zeroth memory plane and the first memory plane may be grouped as a zeroth plane group 1130. In addition, the second memory plane 1110 including the memory bank 0' and the memory bank 1' BK0' and BK1' and the third memory plane 1110 including the memory bank 2' and the memory bank 3' BK2' and BK3' share a peripheral circuit, and accordingly, the second memory plane and the third memory plane may be grouped as a first plane group 1130.

In an embodiment, memory banks 1100 physically adjacent to each other may be grouped to constitute a sub-merge group 1120. In an embodiment, memory banks 1100 that are included in the same plane group 1130 and are included in different memory planes 1110 may be grouped to constitute a sub-merge group 1120. In an embodiment, each of the plane groups 1130 may include a plurality of sub-merge groups 1120.

In an embodiment, memory banks 1100 physically adjacent to each other may be grouped to constitute a merge group 1140. More specifically, sub-merge groups 1120 physically adjacent to each other may be grouped to constitute a merge group 1140. Data output from memory banks 1100 included in one merge group 1140 may be merged as merged data M.DATA. In an embodiment, the merge group 1140 may be configured with memory banks 1100 included in the same plane group 1130, and each of the plane groups 1130 may include at least one merge group 1140. In an embodiment, as shown in FIG. 1, because one plane group 1130 is included in one merge group 1140, the plane group 1130 and the merge group 1140 may be the same, but the present disclosure is not limited to such embodiments. In another embodiment, one plane group 1130 may include two or more merge groups 1140. In an embodiment, memory banks 1100 included in one sub-merge group 1120 are included in the same merge group 1140 but may be included in different memory planes 1110.

In this disclosure, memory banks 1100 physically adjacent to each other may be determined with respect to only a relative distance between memory banks 1100, when memory banks 1100 included in one plane group 1130 are consecutively disposed. As shown in FIG. 1, compressing circuits 1200, merge circuits 1300, and the like are located between memory planes 1110 in one plane group 1130. Because a peripheral circuit including compressing circuits 1200 and merge circuits 1300 may be located on a plane different from a plane on which memory banks 1100 are located, the peripheral circuit may not be considered when deciding whether memory banks 1100 are adjacent to each other. For example, in FIG. 1, compressing circuits 1200 and merge circuits 1300 between the memory bank 0 BK0 and the memory bank 2 BK2 may be located on a plane different from a plane on which the memory banks 1100 are located. Hence, when deciding whether memory banks 1100, except for the compressing circuits 1200 and the merge circuits 1300, are adjacent to each other, the memory bank 0 BK0 and the memory bank 2 BK2 may be memory banks 1100 adjacent to each other. Similarly, the memory bank 0' BK0' and the memory bank 2' BK2', the memory bank 1 BK1 and the memory bank 3 BK3, and the memory bank 1' BK1' and the memory bank 3' BK3' may be memory banks 1100 adjacent to each other.

A compressing circuit 1200 is connected to each of the memory banks 1100. The compressing circuit 1200 may be enabled when the memory device 1000 performs a compression read operation. In an embodiment, the memory device 1000 may perform the compression read operation, based on a command received from outside the memory device 1000. In another embodiment, the memory device 1000 may perform the compression read operation based on its own decision.

When the compression read operation is performed, first, read data R.DATA may be output from each of the memory banks 1100. The read data R.DATA may be output in response to an output control signal OUTPUT_CTR. The output control signal OUTPUT_CTR may be generated based on a supplied clock signal. The clock signal may be provided from outside the memory device 1000 or be provided from a source inside the memory device 1000. Although only output control signals OUTPUT_CTR, OUTPUT_CTR1, OUTPUT_CTR0', and OUTPUT_CTR1' output from the memory bank 0 BK0, the memory bank 1 BK1, the memory bank 0' BK0', and the memory bank 1' BK1' are illustrated in FIG. 1, the present disclosure is not limited to this example, and each memory bank 1100 may output output control signals OUTPUT_CTR.

Subsequently, the read data R.DATA read from each of the memory banks 1100 may be compressed in a compressing circuit 1200 connected to each of the memory bank 1100, and accordingly, compressed data C.DATA may be output from each of the compressing circuit 1200. The compressed data C.DATA may also be output in response to the output control signal OUTPUT_CTR.

The compressing circuit 1200 may compress the read data R.DATA at a compression ratio of 1:N, thereby generating the compressed data C.DATA. N may be a natural number equal to 2 or more. For example, when assuming that N is 4, the compressing circuit 1200 may compress the read data R.DATA at a compression ratio of 1:4, i.e., 25%, thereby generating the compressed data C.DATA. For example, when the read data R.DATA is 16 bits, the 4-bit compressed data C.DATA where N=4 may be output from the compressing circuit 1200.

Compressed data C.DATA output from the compressing circuits 1200 may be merged in a merge circuit 1300. The merge circuit 1300 may merge compressed data C.DATA corresponding to different memory banks 1100. More specifically, the merge circuit 1300 may merge compressed data C.DATA corresponding to memory banks 1100 included in the same merge group 1140. For example, as shown in FIG. 1, memory bank 0 BK0 to memory bank 3 BK3 may be included in one merge group 1140, and compressed data 0 to 3 C.DATA0 to C.DATA3 respectively corresponding to memory bank 0 BK0 to memory bank 3 BK3, may be merged in a first merge circuit 1300. Similarly, memory bank 0' BK0' to memory bank 3' BK3' may be included in another merge group 1140, and compressed data 0' to 3' C.DATA0' to C.DATA3' respectively corresponding to memory bank 0' BK0' to memory bank 3' BK3', may be merged in a second merge circuit 1300. As shown, the merge circuits 1300 generate merged data M. DATA corresponding to the respective merge groups 1140.

In an embodiment, the merge circuit 1300 receives compressed data C.DATA and an output control signal OUTPUT_CTR, which correspond to memory banks 1100 in the merge group 1140, and merges, using the output control signal OUTPUT_CTR, the compressed data C.DATA corresponding to memory banks 1100 in the merge group 1140. In an embodiment, the merge circuit 1300 may latch the compressed data C.DATA corresponding to memory banks 1100 in the merge group 1140 and output the latched compressed data C.DATA based on or in response to the output control signal OUTPUT_CTR, thereby outputting merged data M.DATA obtained by merging the compressed data C.DATA corresponding to memory banks 1100 in the merge group 1140.

The merge circuit 1300 may select and use any one output control signal OUTPUT_CTR among a plurality of output control signals OUTPUT_CTR output from memory banks 1100 in the merge group 1140. For example, when the compressed data 0 to 3 C.DATA0 to C.DATA3 are merged by the merge circuit 1300, the merge circuit 1300 may select and use output control signal 0 OUTPUT_CTR0 output from the memory bank 0 BK0 among output control signals output from memory bank 0 BK0 to memory bank 3 BK3. Accordingly, merged data 0 M.DATA0 may be output in response to the output control signal 0 OUTPUT_CTR0.

The method of selecting the output control signal OUTPUT_CTR is not limited to the above example.

In an embodiment, the merge circuit 1300 may output different data, based on whether the compression read operation is enabled. In an embodiment, when the compression read operation is enabled or active, the merge circuit 1300 may output merged data M.DATA obtained by merging compressed data C.DATA obtained by compressing read data R.DATA read from the memory banks 1100. In another embodiment, when the compression read operation is disabled, i.e., during a normal read operation, the merge circuit 1300 may output the read data R.DATA read from the memory banks 1100 as normal data N. DATA, without merging the data or unmodified data.

The merged data M. DATA output from the merge circuits 1300 is provided to a transmission circuit 1400. The transmission circuit 1400 is connected to the merge circuits 1300 through a plurality of channels, for example, a communication bus or individual communication lines, and selects one or more (some) of the plurality of channels based on a plane group select signal indicating a plane group to be selected among the plane groups 1130. The transmission circuit 1400 outputs data input from the merge circuit 1300 through the selected channels.

In an embodiment, as channels through which merged data M.DATA is transmitted are selected, the transmission circuit 1400 receives the merged data M.DATA from the merge circuit. The transmission circuit 1400 outputs the received merged data M.DATA without additional merging.

The merged data M.DATA output from the transmission circuit 1400 may be latched into an output buffer circuit 1500. The merged data M.DATA latched into the output buffer circuit 1500 may be output based on or in response to the output control signal OUTPUT_CTR. The output buffer circuit 1500 may select any one of output control signals OUTPUT_CTR corresponding to memory banks 1100 included in the merge group 1140 and output the merged data M.DATA in response to the selected output control signal OUTPUT_CTR. For example, when merged data M.DATA0 is obtained by merging the compressed data 0 to 3 C.DATA0 to C.DATA3, the output buffer circuit 1500 selects and uses the output control signal 0 OUTPUT_CTR0 among the output control signals output from memory bank 0 BK0 to memory bank 3 BK3. Accordingly, the merged data 0 M.DATA0 is output from the output buffer circuit 1500 in response to the output control signal 0 OUTPUT_CTR0.

The output control signals OUTPUT_CTR may be output from the memory banks 1100. The output control signals OUTPUT_CTR may be used for outputting and merging of data. For example, the memory banks 1100, the compressing circuits 1200, and the like may output read data R.DATA or compressed data C.DATA in response to an output control signal OUTPUT_CTR. In addition, the merge circuit 1300, the output buffer circuit 1500, and the like may align and output latched data in response to an output control signal OUTPUT_CTR, such that the output control signal OUTPUT_CTR is used for merging of data.

FIG. 2 is a diagram illustrating the merge circuit such as shown in FIG. 1.

Referring to FIG. 1 and FIG. 2, memory bank 0 BK0 to memory bank 3 BK3 may be memory banks 1100 included in the same merge group 1140. Read data 0 R.DATA0 read from memory bank 0 BK0 may be compressed by a compressing circuit 1200, and compressed data 0 C.DATA0 may be output from the compressing circuit 1200. In addition, read data 1 R.DATA1 read from memory bank 1 BK1 may be compressed by a compressing circuit 1200, and compressed data 1 C.DATA1 may be output from the compressing circuit 1200. Read data 2 R. DATA2 read from memory bank 2 BK2 may be compressed by a compressing circuit 1200, and compressed data 2 C.DATA2 may be output from the compressing circuit 1200. Read data 3 R.DATA3 read from memory bank 3 BK3 may be compressed by a compressing circuit 1200, and compressed data 3 C.DATA3 may be output from the compressing circuit 1200.

An output control signal OUTPUT_CTR is output with read data R.DATA from each of the memory banks 1100, and the read data R.DATA is output from each of the memory banks 1100 in response to the output control signal OUTPUT_CTR. Therefore, the read data 0 R.DATA0 through read data 3 R.DATA3 are output in response to output control signals 0 to 3 OUTPUT_CTR0 to OUTPUT_CTR3, respectively.

The compressed data 0 to 3 C.DATA0 to C.DATA3 is merged by the merge circuit 1300. In an embodiment, the merge circuit 1300 includes a D flip-flop. The compressed data 0 to 3 C. DATA0 to C. DATA3 is input to the D flip-flop to be latched. In an embodiment, the merge circuit 1300 includes a quantity of D flip-flops corresponding to a quantity of bits of data read from each memory bank 1100, although the present disclosure is not so limited. For example, when 16-bit data is read from the memory bank 1100, the merge circuit 1300 includes 16 flip-flops. In the normal read operation, 16-bit data read from the memory bank 1100 and latched into the 16 flop-flops. Only one D flip-flop is shown in FIG. 2 for the sake of simplicity of the drawing, although multiple D flip-flops may be utilized, one D flip-flop for each bit of data C.DATA0, C.DATA1, C.DATA2, AND C.DATA3 input to the merge circuit 1300, where each data line C.DATA0, C.DATA1, C.DATA2, AND C. DATA3 is separately directly to a corresponding D flip-flop. In the compression read operation, when read data R.DATA is compressed at a compression ratio of 1:4, i.e., 25% by the compressing circuit 1200, 4-bit compressed data 0 C.DATA0 compressed and output in the compressing circuit 1200, 4-bit compressed data 1 C.DATA1 compressed and output in the compressing circuit 1200, 4-bit compressed data 2 C.DATA2 compressed and output in the compressing circuit 1200, and 4-bit compressed data 3 C.DATA3 compressed and output in the compressing circuit 1200 may be divided to be latched into the 16 flip-flops. When read data R.DATA is compressed at a compression ratio of 1:8, i.e., 12.5% by the compressing circuit 1200, 2-bit compressed data 0 C.DATA0 compressed and output in the compressing circuit 1200, 2-bit compressed data 1 C.DATA1 compressed and output in the compressing circuit 1200, 2-bit compressed data 2 C.DATA2 compressed and output in the compressing circuit 1200, and 2-bit compressed data 3 C.DATA3 compressed and output in the compressing circuit 1200 may be divided to be latched into 8 flip-flops among the 16 flip-flops, and the other 8 flip-flops may not be used.

The latched compressed data 0 to 3 C.DATA0 to C.DATA3 may be aligned and output by an output control signal OUTPUT_CTR input to the D flip-flop, such that merged data 0 M.DATA0 is output. In FIG. 2, the output control signal 0 OUTPUT_CTR0 is used as a clock signal input to the D flip-flop. The present disclosure is not limited to this example. The clock signal input to the D flip-flop may, however, be selected from any of the output control signals 0 to 3 OUTPUT_CTR0 to OUTPUT_CTR3. Accordingly, in an embodiment, the merge circuit 1300 may optionally include a signal selector configured to select the clock signal input to the D flip-flop.

FIG. 3 is a diagram illustrating the transmission circuit and the output buffer circuit, such as shown in FIG. 1.

Referring to FIG. 1 and FIG. 3, the transmission circuit 1400 may include a data selector 1410 and a signal selector 1420.

The data selector 1410 may receive merged data M.DATA output from a plurality of merge circuits 1300. In an embodiment, the data selector 1410 includes one or more data select circuits (not shown), and the data select circuits may be connected to the merge circuits 1300 through a plurality of channels. The data select circuits select one or more (some) channels, based on a plane group select signal indicating a plane to be selected among plane groups. The data selector 1410 outputs merged data M.DATA input through the selected channels. In an embodiment, when the data selector 1410 selects some of the channels, the data selector 1410 may simply output received data as is. The data selector 1410 may not perform merging of the received data.

The signal selector 1420 may receive output control signals OUTPUT_CTR output from memory banks 1100. When the memory device 1000 performs the compression read operation, the signal selector 1420 selects and outputs at least one of the received output control signals OUTPUT_CTR. In an embodiment, the signal selector 1420 selects one of output control signals OUTPUT_CTR corresponding to memory banks 1100 included in one merge group 1140.

For example, as shown in FIG. 3, the data selector 1410 receives merged data 0 M.DATA0 obtained by merging compressed data C.DATA0 to C.DATA3 output from memory bank 0 BK0 to memory bank 3 BK3, and the merged data 0 M.DATA0 is output from a merge circuit 1300 in response to output control signal 0 OUTPUT_CTR0. The data selector 1410 receives merged data 1 M.DATA1 obtained by merging compressed data C.DATA0' to C.DATA3' output from memory bank 0' BK0' to memory bank 3' BK3', and the merged data 1 M.DATA1 is output from the merge circuit 1300 in response to output control signal 0' OUTPUT_CTR0'.

The signal selector 1420 may receive the output control signals 0 and 0' OUTPUT_CTR0 and OUTPUT_CTR0' generated from the memory banks 1100. In an embodiment, the signal selector 1420 may further receive other output control signals output from the memory banks 1100 in addition to output control signals output from the merge circuit 1300. In an embodiment, the signal selector 1420 may select the output control signal 0 OUTPUT_CTR0 as an output control signal corresponding to the merged data 0 M.DATA0 and output the selected output control signal.

When the memory device 1000 performs the normal read operation, the signal selector 1420 receives an output control signal OUTPUT_CTR generated from a memory bank 1100 from which data is read and outputs the received output control signal OUTPUT_CTR as is. For example, although not shown in FIG. 3, the signal selector 1420 may further receive output control signals OUTPUT_CTR output from memory banks 1, 1', 2, 2', 3, and 3' BK1, BK1', BK2, BK2', BK3, and BK3', respectively.

The merged data M.DATA output by the data selector 1410 and the output control signals OUTPUT_CTR selected by the signal selector 1420 may be provided to the output buffer circuit 1500. The output buffer circuit 1500 may include an output control circuit 1510 and a latch group 1520.

The latch group 1520 may include a plurality of latches, and merged data M.DATA output from the transmission circuit 1400 may be latched into the plurality of latches. The output control circuit 1510 provides a data-out control signal DOUT_CTR to the latch group 1520, based on or in response to output control signals OUTPUT_CTR received from the transmission circuit 1400. More specifically, the output control circuit 1510 provides the data-out control signal DOUT_CTR to the latch group 1520 based on or in response to the output control signals OUTPUT_CTR selected or output by the signal selector 1420. The merged data M.DATA latched into the latch group 1520 is output in response to the data-out control signal DOUT_CTR.

FIG. 4 is a diagram illustrating the merge circuit and the transmission circuit, such as shown in FIG. 1.

Referring to FIG. 1 and FIG. 4, merge circuits 1300a and 1300b receive compressed data C.DATA or read data R.DATA (uncompressed data from FIG. 1), output from memory banks 1100. For example, a merge circuit 1300a corresponding to the merge group 1140 included in the zeroth plane group 1130 on the left side of FIG. 1 receives compressed data C.DATA0 to C.DATA3 or normal data N.DATA0 to N.DATA3, output from memory bank 0 BK0 to memory bank3 BK3. In an embodiment, the compressed data C.DATA0 to C.DATA3 may be input through one channel, the normal data N.DATA0 and N.DATA2 may be input through another channel, and the normal data N.DATA1 and N.DATA3 may be input through still another channel. Normal data input through one channel may be normal data output from memory banks 1100 included in one sub-merge group 1120. For example, memory bank 0 BK0 and memory bank 2 BK2 from which normal data 0 and 2 N.data0 and N.data2 are output are included in the same sub-merge group 1120. Memory bank 1 BK1 and memory bank 3 BK3 from which normal data 1 and 3 N.DATA1 and NDATA3 are output, respectively, may be included in the same sub-merge group 1120.

A merge circuit 1300b corresponding to a second merge group 1140 included in the first plane group 1130 on the right side of FIG. 1 receives compressed data C.DATA0' to C.DATA3' or normal data N.DATA0' to N.DATA3', output from memory bank 0' BK0' to memory bank 3' BK3', respectively. In an embodiment, the compressed data C.DATA0' to C.DATA3' may be input through one channel, the normal data N. DATA0' and N. DATA2' may be input through another channel, and the normal data N.DATA1' and N.DATA3' may be input through still another channel. Normal data input through one channel may be normal data output from memory banks 1100 included in one sub-merge group 1120. For example, memory bank 0' BK0' and memory bank 2' BK2' from which normal data 0' and 2' N.data0' and N.data2' are output are included in the same sub-merge group 1120. Memory bank 1' BK1' and memory bank 3' BK3' from which normal data 1' and 3' N. DATA1' and NDATA3' are output may be included in the same sub-merge group 1120.

The merge circuits 1300a and 1300b select data to be input based on whether the compression read operation is enabled or active. In an embodiment, the merge circuits 1300a and 1300b receive a compression read enable signal ESS_EN indicating whether the compression read operation is enabled and selects channels through which data are input to the merge circuits 1300a and 1300b in response to the compression read enable signal ESS_EN. For example, when the compression read enable signal ESS_EN indicates that the compression read operation is enabled, the merge circuit 1300a selects the channels through which the compressed data C.DATA0 to C.DATA3 are input, and the merge circuit 1300*b* selects the channel through which the compressed data C.DATA0' to C.DATA3' are input. For example, when the compression read enable signal ESS_EN indicates that the compression read operation is disabled, i.e., when the compression read enable signal ESS_EN indicates that the normal read operation is performed, the merge circuit 1300*a* selects the channels through which the normal data N.DATA0 to N.DATA3 are input, and the merge circuit 1300*b* selects the channels through which the normal data N.DATA0' to N. DATA3' are input.

The merge circuits 1300*a* and 1300*b* may output the input data through a plurality of channels. In an embodiment, the merge circuit 1300*a* outputs the compressed data C.DATA0 to C.DATA3 or the normal data N.DATA0 and N. DATA2 through channel 0 CH0 and outputs the normal data N.DATA1 and N.DATA3 through channel 1 CH1. The quantity of channels and the kind or type of data output through each channel are not limited to this example. In an embodiment, the merge circuit 1300*b* may output the normal data N.DATA1' and N. DATA3' through channel 2 CH2 and output the compressed data C.DATA0' to C.DATA3' or the normal data N.DATA0' and N.DATA2' through channel 3 CH3. The quantity of channels and the kind or type of data output through each channel are not limited to this example.

The data selector 1410 includes a plurality of data select circuits 1411*a* and 1411*b* that receive data output from the merge circuits 1300*a* and 1300*b*. Each of the data select circuits 1411*a* and 1411*b* may receive data output from different plane groups 1130 and output the received data based on a plane group to be selected. In an embodiment, the data select circuits 1411 receives a plane group select signal SEL_PLG indicating a plane group to be selected, and select data to be output, based on or in response to the plane group select signal SEL_PLG. For example, when the plane group select signal SEL_PLG indicates the zeroth plane group 1130, the data select circuit 1411*a* outputs data DATA0 received through channel 0 CH0, and the data select circuit 1411*b* outputs data DATA1 received through channel 1 CH1. For example, when the plane group select signal indicates the first plane group 1130, the data select circuit 1411*a* outputs data DATA0 received through channel 2 CH, and the data select circuit 1411*b* outputs data DATA1 received through channel 3 CH3.

FIG. 5 is a diagram illustrating an embodiment of the merge circuit such as shown in FIG. 4.

Referring to the example of FIG. 5, the merge circuit 1300 includes a first multiplexing circuit 1310, a second multiplexing circuit 1320, and a latch circuit 1330.

The multiplexing circuits 1310 and 1320 receive compressed data or normal data, output from memory banks 1100, and output data based on whether the compression read operation is enabled. In an embodiment, the first multiplexing circuit 1310 receives normal data N.DATA1 and N.DATA3 or compressed data C.DATA1 and C.DATA3 output from memory bank 1 BK0 and memory bank 3 BK3. In an embodiment, the first multiplexing circuit 1310 receives normal data or compressed data output from memory banks 1100 included in one sub-merge group 1120. The first multiplexing circuit 1310 receives a compression read enable signal ESS_EN indicating whether the compression read operation is enabled and outputs data input according to the received compression read enable signal ESS_EN. For example, when the compression read enable signal ESS_EN indicates that the compression read operation is enabled, the first multiplexing circuit 1310 outputs the compressed data C.DATA1 and C.DATA3. When the compression read enable signal ESS_EN indicates that the compression read operation is disabled, the first multiplexing circuit 1310 outputs the normal data N.DATA1 and N.DATA3. The data output from the first multiplexing circuit 1310 is provided to the transmission circuit 1400 through channel 1 CH1.

In an embodiment, the second multiplexing circuit 1320 receives normal data N.DATA0 and N.DATA2 output from memory bank 0 BK0 and memory bank 2 BK2 or data output from memory bank 1 BK1 and memory bank 3 BK3 via the first multiplexing circuit 1310 and compressed data C.DATA0 and C.DATA2 output from memory bank 0 BK0 and memory bank 2 BK2. Thus, the second multiplexing circuit 1320 receives data output from the first multiplexing circuit 1310. In an embodiment, the second multiplexing circuit 1320 receives normal data output from memory banks 1100 included in one sub-merge group 1120 or compressed data output from memory banks 1100 included in two or more sub-merge groups 1120. The second multiplexing circuit 1320 receives a compression read enable signal ESS_EN indicating whether the compression read operation is enabled or active and outputs data input according to the received compression read enable signal ESS_EN. For example, when the compression read enable signal ESS_EN indicates that the compression read operation is enabled, the first multiplexing circuit 1310 outputs the compressed data C.DATA1 and C.DATA3 as described above, and the second multiplexing circuit 1320 receives the compressed data C.DATA1 and C.DATA3 output from the first multiplexing circuit 1310 and the compressed data C.DATA0 and C.DATA2 output from memory bank 0 BK0 and memory bank 2 BK2. Because the compression read enable signal ESS_EN indicates that the compression read operation is enabled, the second multiplexing circuit 1320 outputs the received compressed data C.DATA0 to C.DATA3. When the compression read enable signal ESS_EN indicates that the compression read operation is disabled, the second multiplexing circuit 1320 outputs the normal data N. DATA0 and N.DATA2. The data output through the second multiplexing circuit 1320 is provided to the latch circuit 1330.

The latch circuit 1330 latches data output from at least one of the multiplexing circuits 1310 and 1320. More specifically, the latch circuit 1330 latches data output through the second multiplexing circuit 1320. The latch circuit 1330 outputs data latched into the latch circuit 1330 based on or in response to output control signals corresponding to at least some of the memory banks 1100. When the compressed data C.DATA0 to C.DATA3 output from the second multiplexing circuit 1320 are latched into the latch circuit 1330, the compressed data C.DATA0 to C.DATA3 is aligned and output based on or in response to the output control signal OUTPUT_CTR, such that merged data M.DATA is output. The data output from the latch circuit 1330 may be provided to the transmission circuit 1400 through channel 0 CH0.

FIG. 6 is a diagram illustrating an example implementation of the merge circuit such as shown in FIG. 5.

Referring to FIG. 6, the first multiplexing circuit 1310 may include a D flip-flop and a multiplexer. The D flip-flop may align and output normal data N.DATA1 and N.DATA3 output from memory bank 1 BK1 and memory bank 3 BK3 included in one sub-merge group 1120 based on or in response to output control signal 1 OUTPUT_CTR1 that is input the to the clock input for the D flip-flop. The multiplexer selects and outputs compressed data C.DATA1 and C.DATA3 or the normal data N.DATA1 and N.DATA3, output from the memory bank 1 BK1 and memory bank 3

BK3 included in the one sub-merge group 1120, based on or in response to the compression read enable signal ESS_EN. In an embodiment, when the compression read operation is performed, the compressed data C.DATA1 and C. DATA3 may be subsequently aligned in time in the latch circuit 1330. The compressed data C.DATA1 and C.DATA3 may not be aligned in time in the first multiplexing circuit 1310. Accordingly, the multiplexer may be located posterior or prior to the D flip-flop, but the present disclosure is not limited to this connection order. In an embodiment, the first multiplexing circuit 1310 receives normal data output from memory banks 1100 included in one sub-merge group 1120 or compressed data output from memory banks 1100 included in the one sub-merge group 1120.

The second multiplexing circuit 1320 includes a multiplexer. The multiplexer receives, as a first input, normal data N. DATA0 and N. DATA2 output from memory bank 0 BK0 and memory bank 2 BK2 included on one sub-merge group 1120. The multiplexer receives, as a second input, compressed data C.DATA0 and C.DATA2 output from memory bank 0 BK0 and memory bank 2 BK2 included in the one sub-merge group 1120 and data output from the first multiplexing circuit 1310. In an embodiment, the second multiplexing circuit 1320 receives normal data output from memory banks 1100 included in one sub-merge group 1120 or compressed data output from memory banks 1100 included in two or more sub-merge groups 1120. For example, when the compression read operation is enabled, the compressed data 1 C.DATA1 and compressed data 3 C.DATA3 is output from the first multiplexing circuit 1310. Accordingly, the compressed data 0 to 3 C.DATA0 to C.DATA3 is input as the second input of the multiplexer included in the second multiplexing circuit 1320. The multiplexer selects and outputs data input as the first input or the second input based on or in response to the compression read enable signal ESS_EN. In an embodiment, when the compression read operation is performed, the compressed data 0 to 3 C.DATA0 to C.DATA3 input as the second input of the multiplexer is output by the multiplexer of the second multiplexing circuit 1320.

The latch circuit 1330 includes a D flip-flop that latches data output from the second multiplexing circuit 1320. The D flip-flop receives the output control signal OUTPUT_CTR0 via the D flip-flop's clock signal input and outputs the latched data based on or in response to the received output control signal OUTPUT_CTR0. The output control signal OUTPUT_CTR0 input to the D flip-flop is not limited to a specific output control signal. In an embodiment, when the compression read operation is performed, the compressed data 0 to 3 C.DATA0 to C.DATA3 output from the second multiplexing circuit 1320 is latched into the D flip-flop. The latched compressed data 0 to 3 C.DATA0 to C.DATA3 may be aligned and output by the output control signal OUTPUT_CTR0 input to the D flip-flop, such that merged data 0 M.DATA0 is output.

FIG. 7 is a diagram illustrating the merge circuit and the transmission circuit, such as shown in FIG. 4, during a normal read operation.

Referring to FIG. 1 and FIG. 4 through FIG. 7, the merge circuit 1300a corresponding to the merge group 1140 included in the zeroth plane group 1130 and the merge circuit 1300b corresponding to the merge group 1140 included in the first plane group 1130 include multiplexing circuits 1310a, 1310b, 1320a, and 1320b and latch circuits 1330a and 1330b, respectively.

The multiplexing circuits 1310a, 1310b, 1320a, and 1320b may correspond to sub-merge groups 1120. In the embodiments shown in FIG. 7 through FIG. 9, a first multiplexing circuit 1310a corresponds to the sub-merge group 1120 including memory bank 1 BK1 and memory bank 3 and BK3, and a second multiplexing circuit 1320a corresponds to the sub-merge group 1120 including memory bank 0 BK0 and memory bank2 BK2. The present disclosure is not limited thereto. For example, in another embodiment, the first multiplexing circuit 1310a may correspond to the sub-merge group 1120 including memory bank 0 BK0 and memory bank 2 BK2, and the second multiplexing circuit 1320a may correspond to the sub-merge group 1120 including memory bank 1 BK1 and memory bank 3 BK3. Input/output channels connected to the merge circuit 1300 are changed accordingly.

In the embodiments shown in FIG. 7 through FIG. 9, a first multiplexing circuit 1310b corresponds to the sub-merge group 1120 including memory bank 0' BK0' and memory bank 2' BK2', and a second multiplexing circuit 1320b corresponds to the sub-merge group 1120 including memory bank 1' BK1' and memory bank 3' BK3'. The present disclosure is not limited to this example. For example, in another embodiment, the first multiplexing circuit 1310b may correspond to the sub-merge group 1120 including memory bank 1' BK1' and memory bank 3' BK3', and the second multiplexing circuit 1320b may correspond to the sub-merge group 1120 including memory bank 0' BK0' and memory bank 2' BK2'. Input/output channels connected to the merge circuit 1300 are changed accordingly. For example, unlike as shown in FIG. 7, when the first multiplexing circuit 1310b corresponds to the sub-merge group 1120 including memory bank 0' BK0' and memory bank 2' BK2', and the second multiplexing circuit 1320b corresponds to the sub-merge group 1120 including memory bank 1' BK1' and memory bank 3' BK3', channel 2 CH2 output from the first multiplexing circuit 1310b is connected to the data select circuit 1411b, and channel 3 CH3 output from the second multiplexing circuit 1320b is connected to the data select circuit 1411a. The memory device 1000 may perform the normal read operation on the zeroth plane group 1130. Accordingly, a compression read enable signal ESS_EN may indicate that the compression read operation is disabled, i.e., the normal read operation is performed, and a plane group select signal SEL_PLG may indicate the zeroth plane group 1130. Accordingly, the compression read enable signal ESS_EN may have a value of 0, and the plane group select signal SEL_PLG may have the value of 0.

A multiplexer included in the first multiplexing circuit 1310a corresponding to the merge group 1140 included in the zeroth plane group 1130 outputs normal data N.DATA1 and N.DATA3 output from memory bank 1 BK1 and memory bank 3 BK3 included in the same sub-merge group 1120 when the compression read enable signal ESS_EN has the value of 0. The normal data N. DATA1 and N.DATA3 output from memory bank 1 BK1 and memory bank 3 BK3 may be aligned in response to output control signal 1 OUTPUT_CTR1 before the normal data N.DATA1 and N.DATA3 are input to the multiplexer. The normal data N.DATA1 and N.DATA3 output from the first multiplexing circuit 1310a are input to the data select circuit 1411b through channel 1 CH1.

A multiplexer included in the second multiplexing circuit 1320a corresponding to the merge group 1140 included in the zeroth plane group 1130 outputs normal data N.DATA0 and N.DATA2 output from memory bank 0 BK0 and memory bank 2 BK2 included in the same sub-merge group 1120 when the compression read enable signal ESS_EN has the value of 0. The normal data N. DATA0 and N.DATA2 output from the second multiplexing circuit 1320a are output in response to output control signal 0 OUTPUT_CTR0 after the normal data N. DATA0 and N.DATA2 are latched into the latch circuit 1330a. Thus, the normal data N.DATA0 and N. DATA2 latched into the latch circuit 1330a are aligned based on or in response to the output control signal 0 OUTPUT_CTR0. The normal data N.DATA0 and N.DATA2 aligned and output from the latch circuit 1330a are input to the data select circuit 1411a through channel 0 CH0.

The data select circuit 1411a outputs the normal data N. DATA0 and N.DATA2 input through channel 0 CH0 to a zeroth output line GDL0 when the plane group select signal SEL_PLG has the value of 0 as shown in FIG. 7. In addition, the data select circuit 1411b outputs the normal data N.DATA1 and N. DATA3 input through channel 1 CH1 to a first output line GDL1 when the plane group select signal SEL_PLG has the value of 0 as shown in FIG. 7.

When the compression read enable signal ESS_EN and the plane group select signal SEL_PLG both have the value of 0, the normal data N.DATA0 and N.DATA2 input to the second multiplexing circuit 1320a corresponding to the merge group 1140 included in the zeroth plane group 1130 are output to the zeroth output line GDL0, and the normal data N. DATA1 and N.DATA3 input to the first multiplexing circuit 1310a corresponding to the merge group 1140 included in the zeroth plane group 1130 are output to the first output line GDL1.

FIG. 8 is a diagram illustrating the merge circuit and the transmission circuit, such as shown in FIG. 4, during a normal read operation.

Referring to FIG. 1, FIG. 4 through FIG. 6, and FIG. 8, the memory device 1000 performs the normal read operation on the first plane group 1130. Accordingly, a compression read enable signal ESS_EN indicates the compression read operation is disabled, i.e., the normal read operation is performed, and a plane group select signal SEL_PLG indicates the first plane group 1130. Accordingly, the compression read enable signal ESS_EN has a value of 0, and the plane group select signal SEL_PLG has a value of 1.

The multiplexer included in the first multiplexing circuit 1310b corresponding to the merge group 1140 included in the first plane group 1130 outputs normal data N.DATA0' and N.DATA2' output from memory bank 0' BK0' and memory bank 2' BK2' included in the same sub-merge group 1120 when the compression read enable signal ESS_EN having the value of 0. The normal data N. DATA0' and N.DATA2' output from memory bank 0' BK0' and memory bank 2' BK2' may be aligned in response to output control signal 0' OUTPUT_CTR0' before the normal data N.DATA0' and N. DATA2' are input to the multiplexer. The normal data N.DATA0' and N.DATA2' output from the first multiplexing circuit 1310b are input to the data select circuit 1411a through channel 2 CH2.

The multiplexer included in the second multiplexing circuit 1320b corresponding to the merge group 1140 included in the first plane group 1130 outputs normal data N.DATA1' and N.DATA3' output from memory bank 1' BK1' and memory bank 3' BK3' included in the same sub-merge group 1120 when the compression read enable signal ESS_EN has the value of 0. The normal data N.DATA1' and N.DATA3' output from the second multiplexing circuit 1320b are output in response to output control signal 1' OUTPUT_CTR1' after the normal data N.DATA1' and N.DATA3' are latched into the latch circuit 1330b. The normal data N. DATA1' and N. DATA3' latched into the latch circuit 1330b may be aligned based on or in response to the output control signal 1' OUTPUT_CTR1'. The normal data N.DATA1' and N.DATA3' aligned and output from the latch circuit 1330b are input to the data select circuit 1411b through channel 3 CH3.

The data select circuit 1411a outputs the normal data N. DATA0' and N.DATA2' input through channel 2 CH2 to the zeroth output line GDL0 when the plane group select signal SEL_PLG has the value of 1. The data select circuit 1411b outputs normal data N.DATA1' and N.DATA3' input through channel 3 CH3 to the first output line GDL1 when the plane group select signal SEL_PLG has the value of 1.

According to the compression read enable signal ESS_EN and the plane group select signal SEL_PLG, the normal data N.DATA0' and N.DATA2' input to the first multiplexing circuit 1310b corresponding to the merge group 1140 included in the first plane group 1130 are output to the zeroth output line GDL0, and the normal data N. DATA1' and N. DATA3' input to the second multiplexing circuit 1320b corresponding to the merge group 1140 included in the first plane group 1130 are output to the first output line GDL1.

FIG. 9 is a diagram illustrating the merge circuit and the transmission circuit, such as shown in FIG. 4, during a compression read operation.

Referring to FIG. 1, FIG. 4 through FIG. 6, and FIG. 9, the memory device 1000 performs the compression read operation. Accordingly, a compression read enable signal ESS_EN indicates the compression read operation is enabled, i.e., the normal read operation is disabled, and a plane group select signal SEL_PLG indicates the zeroth plane group 1130 or the first plane group 1130. Accordingly, the compression read enable signal ESS_EN has a value of 1, the plane group select signal SEL_PLG input to the data select circuit 1411a has a value of 0, and the plane group select signal SEL_PLG input to the data select circuit 1411b has the value of 1.

The multiplexer included in the first multiplexing circuit 1310a corresponding to the merge group 1140 included in the zeroth plane group 1130 outputs compressed data C.DATA1 and C.DATA3 output from memory bank 1 BK1 and memory bank 3 BK3 included in the same sub-merge group 1120 when the compression read enable signal ESS_EN has the value of 1. The compressed data C.DATA1 and C.DATA3 output from the first multiplexing circuit 1310a is input to the second multiplexing circuit 1320a.

The multiplexer included in the second multiplexing circuit 1320a corresponding to the merge circuit 1140 included in the zeroth plane group 1130 outputs compressed data C.DATA0 and C.DATA2 output from memory bank 0 BK0 and memory bank2 BK2 included in the same sub-merge group 1120 and the compressed data C.DATA1 and C.DATA3 input from the first multiplexing circuit 1310a when the compression read enable signal ESS_EN has the value of 1. The compressed data C.DATA0 to C.DATA3 output from the second multiplexing circuit 1320a are output in response to output control signal 0 OUTPUT_CTR0 after the compressed data C.DATA0 to C.DATA3 are latched into the latch circuit 133a. The compressed data C.DATA0 to C.DATA3 latched into the latch circuit 1330a are aligned based on or in response to the output control signal 0 OUTPUT_CTR0. In an embodiment, the aligned and output compressed data C.DATA0 to C.DATA3 are merged data M.DATA0. The merged data M.DATA0 output from the latch circuit 1330a are input to the data select circuit 1411a through channel 0 CH0.

The multiplexer included in the first multiplexing circuit 1310b corresponding to the merge group 1140 included in the first plane group 1130 outputs compressed data C.DATA0' and C.DATA2' output from memory bank 0' BK0' and memory bank 2' BK2' included in the same sub-merge group 1120 when the compression read enable signal ESS_EN has the value of 1. The compressed data C.DATA0' and C.DATA2' output from the first multiplexing circuit 1310b is input to the second multiplexing circuit 1320b.

The multiplexer included in the second multiplexing circuit 1320b corresponding to the merge group 1140 included in the first plane group 1130 outputs compressed data C.DATA1' and C.DATA3' output from memory bank 1' BK1' and memory bank 3' BK3' included in the same sub-merge group 1120 and the compressed data C.DATA0' and C.DATA2' output from the first multiplexing circuit 1310b when the compression read enable signal ESS_EN has the value of 1. The compressed data C.DATA0' to C.DATA3' output from the second multiplexing circuit 1320b is output in response to output control signal 1' OUTPUT_CTR1' after the compressed data C.DATA0' to C.DATA3' are latched into the latch circuit 1330b. The compressed data C.DATA0' to C.DATA3' latched into the latch circuit 1330b are aligned based on or in response to the output control signal 1' OUTPUT_CTR1'. In an embodiment, the aligned and output compressed data C.DATA0' to C.DATA3' are merged data M.DATA1. The merged data M.DATA1 output from the latch circuit 1330b are input to the data select circuit 1411b through channel 3 CH3.

The data select circuit 1411a outputs the merged data M.DATA0 input through channel 0 CH0 to the zeroth output line GDL0 when the plane group select signal SEL_PLG has the value of 0. In addition, the data select circuit 1411b outputs the merged data M.DATA1 input through channel 3 CH3 to the first output line GDL1 when the plane group select signal SEL_PLG has the value of 1.

According to the compression read enable signal ESS_EN and the plane group select signal SEL_PLG, the compressed data C.DATA1 and C.DATA3 input to the first multiplexing circuit 1310a corresponding to the merge group 1140 included in the zeroth plane group 1130 and the compressed data C.DATA0 and C.DATA2 input to the second multiplexing circuit 1320a corresponding to the merge group 1140 included in the zeroth plane group 1130 are merged as output to the zeroth output line GDL0. The compressed data C.DATA1' and C.DATA3' input to the first multiplexing circuit 1310b corresponding to the merge group 1140 included in the first plane group 1130 and the compressed data C.DATA0' and C.DATA2' input to the second multiplexing circuit 1320b corresponding to the merge group 1140 included in the first plane group 1130 are merged as output to the first output line GDL1.

In an embodiment, the output buffer circuit 1500 may output merged data M.DATA latched into the output buffer circuit 1500, based on or in response to an output control signal OUTPUT_CTR, corresponding to the second multiplexing circuits 1320a and 1320b, among the output control signals OUTPUT_CTR. In an embodiment, as shown in FIG. 7, the output buffer circuit outputs the merged data M.DATA latched into the output buffer circuit 1500 based on or in response to output control signal 1 OUTPUT CTR1 and output control signal 1' OUTPUT_CTR1'. In another embodiment, unlike as shown in FIG. 7, when the first multiplexing circuit 1310b corresponds to the sub-merge group 1120 including memory bank 1' BK1' and memory bank 3' BK3' and the second multiplexing circuit 1320b corresponds to the sub-merge group 1120 including memory bank 0' BK0' and memory bank 2' BK2', the output buffer circuit 1500 may output the merged data M.DATA latched into the output buffer circuit 1500, based on or in response to output control signal 0 OUTPUT_CTR0 and output control signal 0' OUTPUT_CTR0'.

FIG. 10 is a block diagram illustrating an alternative embodiment of the memory controller shown in FIG. 1.

Referring to FIG. 10, a memory device 100 may include a memory cell array 110, a voltage generator 120, an address decoder 130, an input/output circuit 140, and control logic 150.

The memory cell array 110 includes a plurality of memory blocks BLK1 to BLKz, where z is an integer. The plurality of memory blocks BLK1 to BLKz are connected to the address decoder 130 through row lines RL. The plurality of memory blocks BLK1 to BLKz may be connected to the input/output circuit 140 through column lines CL. In an embodiment, the row lines RL may include word lines, source select lines, and drain select lines. In an embodiment, the column lines may include bit lines.

Each of the plurality of memory blocks BLK1 to BLKz includes a plurality of memory cells. In an embodiment, the plurality of memory cells may be nonvolatile memory cells.

In any one memory block BLKi, where i is an integer, among the plurality of memory blocks, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLn and a source line SL, where n is an integer. The bit lines BL1 to BLn may be respectively connected to the strings ST, and the source line SL may be commonly connected to the strings ST. The strings ST may be configured identically to one another, and a string ST connected to a first bit line BL1 is described below in detail as an example.

The string ST may include a source select transistor SST, a plurality of memory cells MC1 to MC16, and a drain select transistor DST, which are connected in series to each other between a source line SL and a first bit line BL1. At least one source select transistor SST and at least one drain select transistor DST may be included in one string ST., The quantity of memory cells is greater than the quantity of the memory cells MC1 to MC16 shown in the drawing, which quantity of memory cells is included in the one string ST.

A source of the source select transistor SST is connected to the source line SL, and a drain of the drain select transistor DST is connected to the first bit line BL1. The memory cells MC1 to MC16 are connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells MC1 to MC16 are connected to a plurality of word lines WL1 to WL16. A group of memory cells connected to the same word line among memory cells included in different strings ST may be referred to as a physical page PPG. Therefore, the quantity of physical pages PPG corresponds to the quantity of word lines WL1 to WL16 included in the memory block BLKi.

Each of the memory cells may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The SLC stores one-bit data. One physical page PPG of the SLC may store one logical page data. One logical page data may include a quantity of data bits corresponding to the quantity of cells included in one physical page PPG.

The MLC, the TLC, and the QLC may store two-or-more-bit data. One physical page PPG may store two or more logical page data.

The memory cell array 110 is configured with a plurality of memory banks including a plurality of memory blocks. The memory banks may be identical to the memory banks 1100 described with respect to FIG. 1. The memory cell array 110 includes a plurality of memory planes, and each of the memory planes includes a plurality of memory banks, as described above.

In an embodiment, the voltage generator 120, the address decoder 130, and the input/output circuit 140 are commonly designated as peripheral circuits. The peripheral circuits may drive the memory cell array 110 under the control of the control logic 150. The peripheral circuit drives the memory cell array 110 to perform a program operation, a read operation, and an erase operation. Memory planes sharing a peripheral circuit may be grouped as a plane group. In an embodiment, the plane group includes one or more merge groups configured with adjacent memory banks, and each of the merge groups includes one or more sub-merge groups configured with adjacent memory banks. In an embodiment, each of the sub-merge groups includes memory banks included in different memory planes.

The voltage generator 120 generates a plurality of operating voltages by using an external power voltage supplied to the memory device 100. The voltage generator 120 may be operated under the control of the control logic 150.

In an embodiment, the voltage generator 120 generate an internal power voltage by regulating the external power voltage. The internal power voltage generated by the voltage generator 120 is used as an operating voltage for the memory device 100.

In an embodiment, the voltage generator 120 generates a plurality of operating voltages by using the external power voltage or the internal power voltage. The voltage generator 120 may generate various voltages utilized by the memory device 100. For example, the voltage generator 120 may generate a plurality of erase voltages, a plurality of program voltages, a plurality of pass voltages, a plurality of select read voltages, and a plurality of unselect read voltages.

In order to generate a plurality of operating voltages having various voltage levels, the voltage generator 120 may include a plurality of clamping capacitors that receive the internal power voltage. The voltage generator 120 may generate the plurality of operating voltages by selectively enabling the plurality of clamping capacitors under the control of the control logic 150.

The plurality of operating voltages generated by the voltage generator 120 may be supplied to the memory cell array 110 by the address decoder 130.

The address decoder 130 is shown connected to the memory cell array 110 through the row lines RL. The address decoder 130 is operated under the control of the control logic 150. The address decoder 130 receives an address ADDR from the control logic 150. The address decoder 130 decodes a block address from the received address ADDR. The address decoder 130 selects at least one memory block from among the plurality of memory blocks BLK1 to BLKi according to the decoded block address. The address decoder 130 decodes a row address from the received address ADDR. The address decoder 130 selects at least one word line from among the word lines of the selected memory block according to the decoded row address. In an embodiment, the address decoder 130 decodes a column address in the received address ADDR. The address decoder 130 connects the input/output circuit 140 and the memory cell array 110 to each other according to the decoded column address.

The address decoder 130 may include components such as a row decoder, a column decoder, and an address decoder, for example.

The input/output circuit 140 may include a plurality of page buffers. The plurality of page buffers may be connected to the memory cell array 110 through the bit lines. In a program operation, data may be stored in selected memory cells according to data stored in the plurality of page buffers. In a read operation, the data stored in the selected memory cells may be sensed through the bit lines, and the sensed data may be stored in the page buffers.

The input/output circuit 140 may include a plurality of compressing circuits. The compressing circuits may be connected to a plurality of page buffers. More specifically, each of the compressing circuits may be connected to page buffers connected to memory banks corresponding thereto. The compressing circuits may be identical to the compressing circuits 1200 described with respect to FIG. 1. The compressing circuit may compress and output data read from the memory cell array 110 when a compression read operation is performed under the control of the control logic 150.

The input/output circuit 140 includes a plurality of merge circuits, a transmission circuit, and an output buffer circuit. The merge circuit may be connected to two or more compressing circuits, and the transmission circuit may be connected to two or more merge circuits. The merge circuit and the transmission circuit may be identical to the merge circuit 1300 and the transmission circuit 1400 described with respect to FIG. 1. The merge circuit may merge and output data output from compressing circuits. More specifically, the merge circuit may merge compressed data corresponding to the memory banks grouped as the above-described merge group. The transmission circuit may transmit data output from the merge circuits to the output buffer circuit. The output buffer circuit may be identical to the output buffer circuit 1500 described with respect to FIG. 1.

The control logic 150 controls the address decoder 130, the voltage generator 120, and the input/output circuit 140. The control logic 150 may be operated in response to a command CMD transferred from an external device. The control logic 150 may control the peripheral circuits by generating control signals in response to the command CMD and the address ADDR. The control logic 150 control the peripheral circuits such that the memory device 100 performs the normal read operation or the compression read operation.

FIG. 11 is a block diagram illustrating a storage device in accordance with an embodiment of the present disclosure.

Referring to FIG. 11, the storage device 50 includes a memory device 100 and a memory controller 200. The storage device 50 may be a device for storing data under the control of a host, such as a mobile phone, a smart phone, an MP3 player, a laptop computer, a desktop computer, a game console, a television, a tablet personal computer, or an in-vehicle infotainment system. Alternatively, the storage device 50 may be a device for storing data under the control of the host for storing high-capacity data in one place, such as a server or a data center.

The storage device 50 may be manufactured as any one of various types of storage devices according to a host interface that utilizes a communication scheme with the host. The storage device 50 may be manufactured having any one of various kinds of package types.

The memory device 100 stores data. The memory device 100 operates under the control of the memory controller 200. The memory device 100 may be memory device 1000 shown in FIG. 1 or memory device 100 shown in FIG. 10, for example. The memory device 100 may include a memory cell array 100 including a plurality of memory cells, an input/output (I/O) circuit 140 that is connected to the memory cell array 110 and outputs data read from the memory cells, and control logic 150 that controls peripheral circuits. The memory cell array 110 may include a plurality of memory banks each including a plurality of memory blocks, as described above. Each of the memory blocks may include a plurality of pages. In an embodiment, the page may be a unit for storing data in the memory device 100 or reading data stored in the memory device 100. The memory block may be a unit for erasing data.

In an embodiment, the memory device 100 may be any one of various types of volatile memories or nonvolatile memories. In this specification, for ease of description, the memory device 100 is described presuming a NAND flash memory, although other types memory may apply.

The memory device 100 receives a command and an address from the memory controller 200, and accesses an area selected by the address in the memory cell array. The memory device 100 performs an operation indicated by the command on the area selected by the address. For example, the memory device 100 may perform a write operation (program operation), a read operation, and an erase operation. During the program operation, the memory device 100 programs data in the area selected by the address. During the read operation, the memory device 100 reads data from the area selected by the address. During the erase operation, the memory device 100 erases data stored in the area selected by the address.

The memory controller 200 may control overall operation of the storage device 50.

When power is applied to the storage device 50, the memory controller 200 executes firmware (FW). When the memory device 100 is a flash memory device, the memory controller 200 executes FW such as a Flash Translation Layer (FTL) for controlling communication between the host and the memory device 100.

In an embodiment, the memory controller 200 receives a Logical Address (LA) input from the host and translates the LA into a Physical Address (PA) indicating addresses of memory cells in the memory device 100 in which data is to be stored or from which data is to be read.

The memory controller 200 controls the memory device 100 to perform a write operation, a read operation, an erase operation, or the like in response to a request from the host. During the program operation, the memory controller 200 provides a write command, a PA, and data to the memory device 100. During the read operation, the memory controller 200 provides a read command and a PA to the memory device 100. During the erase operation, the memory controller 200 provides an erase command and a PA to the memory device 100.

In an embodiment, the memory controller 200 autonomously generates a command, an address, and data regardless of any request from the host, and transmits the command, the address, and the data to the memory device 100. For example, the memory controller 200 provides the memory device 100 with a command, an address, and data, which are used to perform program, read, and erase operations associated with performing wear leveling, read reclaim, garbage collection, and the like.

In an embodiment, the memory controller 200 may control at least two memory devices 100. The memory controller 200 may control the memory devices according to an interleaving scheme in order to improve operational performance. The interleaving scheme may be a scheme for controlling operations on at least two memory devices 100 that overlap with each other.

In an embodiment, the memory controller 200 includes a read operation manager 210. The read operation manager 210 controls the memory device 100 to perform a compression read operation or a normal read operation. For example, the read operation manager 210 determines whether the memory device 100 performs the compression read operation or the normal read operation, and provides a compression read command or a normal read command to the memory device 100 according to whether the memory device 100 is to perform the compression read operation or the normal read operation. The control logic 150 controls the peripheral circuits including the I/O circuit 140 to perform the compression read operation or the normal read operation in response to the received command. Accordingly, data read from the memory cell array 110 are output to the memory controller 200 through the I/O circuit 140. When the memory device 100 receives the compression read command, the I/O circuit 140 provides the memory controller 200 with read data compressed through a compression operation. The compressed read data may be data obtained by compressing data read from a plurality of memory banks and then merging the compressed data in a merge group unit, such as described above. When the memory device 100 receives the normal read command, the I/O circuit 140 provides the memory controller 200 with normal data that does not undergo the compression operation. The normal data is data obtained without performing compression and merging on data read from memory banks.

In an embodiment, the compression read operation may be performed using an Efficient Soft Sensing (ESS) scheme. The ESS scheme may be a scheme of simultaneously compressing data of a plurality of areas in the memory cell array 110 and merging and outputting the compressed data together.

FIG. 12 is a diagram illustrating another embodiment of a memory controller shown in FIG. 11.

Referring to FIG. 12, a memory controller 2000 may include a processor 2010, internal memory 2020, an Error Checking & Correcting (ECC) circuit 2030, a host interface 2040, a buffer memory interface 2050, and a memory interface 2060.

The processor 2010 may perform various calculations for controlling the memory device 100 or generate various commands. When the processor 2010 receives a request from the host 400, the processor 2010 may generate a command according to the received request and transmit the generated command to a queue controller (not shown). The processor 2010 may control a next operation on the memory device 100 based on a verify result that the memory interface 2060 receives from the memory device 100. In an embodiment, the processor 2010 generates a normal read command or a compression read command.

The internal memory 2020 store various information utilized during operation of the memory controller 2000. For example, the internal memory 2020 may include logical and physical address map tables.

The ECC circuit 2030 is configured to detect and correct one or more errors within data received from the memory device 100 by using an error correction code. The processor 2010 may adjust a read voltage according to an error detection result of the ECC circuit 2030 and control the memory device 100 to perform re-reading. In an exemplary embodiment, an error correction block may be provided as a component of the memory controller 2000.

The host interface 2040 may exchange commands, addresses, data, and the like between the memory controller 2000 and the host 400. For example, the host interface 2040 may receive requests, addresses, data, and the like from the host 400, and output data read from the memory device 100 to the host 400. The host interface 2040 may communicate with the host 400 using various protocols.

The buffer memory interface 2050 may transfer data between the processor 2010 and a buffer memory. The buffer memory may be used as a working memory or a cache memory of the memory controller 2000 and store data used in the storage device. The buffer memory may be used as a read buffer, a write buffer, a map buffer, or the like by the processor 2010.

The memory interface 2060 may exchange commands, addresses, data, and the like between the memory controller 2000 and the memory device 100. For example, the memory interface 2060 may transmit commands, addresses, data, and the like to the memory device 100 through a channel and receive data and the like from the memory device 100. The memory interface 2060 may provide the compression read command or the normal read command to the memory device 100 according to an instruction of the processor 2010. Accordingly, the memory interface 2060 may receive compression read data or normal read data from the memory device 100.

FIG. 13 is a flowchart illustrating an operating method of a memory device in accordance with an embodiment of the present disclosure.

Referring to FIGS. 1 and 13, the compressing circuits 1200 of the memory device 1000 compress S1301 read data R.DATA provided from the memory banks 1100, and accordingly, output compressed data C.DATA from the compressing circuits 1200.

The merging circuits 1300 of the memory device 1000 merge S1303 the compressed data C.DATA, based on or in response to an output control signal OUTPUT_CTR corresponding to at least one of the memory banks 1100. In an embodiment, compressed data C.DATA corresponding to memory banks 1100 grouped as a merge group 1140 is merged. In an embodiment, the merge group 1140 is configured with a plurality of memory banks 1100 included in the same plane group 1130, and the plane group 1130 is configured with memory planes 1110 sharing a peripheral circuit. One plane group 1130 includes one or more merge groups 1140. In an embodiment, the merge group 1140 is configured with memory banks 1100 physically adjacent to each other. More specifically, the merge group 1140 is configured with sub-merge groups 1120 physically adjacent to each other. In an embodiment, the compressed data C.DATA output from the compressing circuits 1200 is latched into the merge circuits 1300. As data latched in response to the output control signal OUTPUT_CTR are output from the merge circuits 1300, merged data M.DATA is output.

The merged data M.DATA output from the merge circuits 1300 is latched into the output buffer circuit 1500. Data latched into the output buffer circuit 1500 of the memory device 1000 is output S1305 from the output buffer circuit 1500 in response to at least one output control signal OUTPUT_CTR among a plurality of output control signals OUTPUT_CTR output by the memory banks 1100.

FIG. 14 is a flowchart illustrating details for FIG. 13.

Referring to FIG. 14, the merge circuits 1300 of the memory device 1000 latch S1401 compressed data C.DATA corresponding to the memory banks 1100. In an embodiment, the merge circuits 1300 correspond to the merge groups 1140. Accordingly, the merge circuits 1300 latch compressed data C.DATA corresponding to memory banks 1100 included in the same merge group 1140. The merge circuits 1300 select at least one (e.g., some) of channels through which data are input, based on whether a compression read mode is enabled. Accordingly, the merge circuits 1300 select data to be output and latch the selected data.

The merge circuits 1300 of the memory device 1000 output S1403 the latched compressed data C.DATA based on or in response to an output control signal OUTPUT_CTR. In an embodiment, the output control signal OUTPUT_CTR is selected from output control signals output from memory banks 1100 included in the same merge group. The latched compressed data C.DATA may be aligned and output in response to the output control signal OUTPUT_CTR, and the output of the aligned compressed data C.DATA may be output as merged data M. DATA obtained by merging the compressed data C.DATA.

FIG. 15 is a flowchart illustrating details for FIG. 13.

Referring to FIG. 15, the transmission circuit 1400 of the memory device 1000 receives merged data M. DATA from the merge circuits 1300. The transmission circuit 1400 selects at least one (some) of the channels through which data are input based on or in response to a plane group select signal indicating a plane group 1130 to be selected. Accordingly, the transmission circuit 1400 selects data to be output. The transmission circuit 1400 outputs S1501 merged data M.DATA to the output buffer circuit 1500 according to the plane group select signal.

The output buffer circuit 1500 of the memory device 1000 latches S1503 the merged data M.DATA received from the transmission circuit 1400 and outputs the latched merged data M.DATA based on or in response to an output control signal OUTPUT_CTR.

In accordance with the present disclosure, a memory device capable of reducing or preventing a merge failure that may occur in a merging process of data when a compression read operation is performed while having a relatively simple structure, an operating method of a memory device, and a storage device are provided.

While the present disclosure is shown and described with reference to certain embodiments or examples, those skilled in the art will understand that various changes in form and details may be made without departing from the spirit and scope of the present disclosure as included in the appended claims and their equivalents. Therefore, the scope of the present disclosure should not be limited to the above-described embodiments but should be determined by not only the appended claims but also the equivalents thereof.

In the above-described embodiments, all processes may be selectively performed or some of the processes may be omitted. In each embodiment, the processes are not necessarily performed in accordance with the described order and may be rearranged. The embodiments disclosed in this specification and drawings are only examples to facilitate an understanding of the present disclosure, and the present disclosure is not limited to these embodiments or examples. Various modifications can be made by those skilled in the art on the basis of the technological scope of the present disclosure in addition to the embodiments disclosed herein.

Meanwhile, the exemplary embodiments of the present disclosure have been described in the drawings and specification. Although specific terminologies are used here, those terminologies are utilized for ease of explanation of the embodiments of the present disclosure and are not otherwise limiting. Therefore, the present disclosure is not restricted to the above-described embodiments and many variations are possible within the spirit and scope of the present disclosure.

What is claimed is:

1. A memory device comprising:
a plurality of memory planes, each including a plurality of memory banks;
one or more plane groups, each plane group comprising at least two memory planes sharing at least one peripheral circuit;
a plurality of compressing circuits, wherein each compressing circuit is connected to a corresponding memory bank of the plurality of memory banks and outputs compressed data by compressing data read from the corresponding memory bank of the plurality of memory banks in a compression read operation;
a plurality of merge circuits, each merge circuit receiving compressed data and at least one of a plurality of output control signals corresponding to a merge group of a plurality of merge groups, each merge circuit outputting, in response to at least one of the plurality of output control signals, merged data obtained by merging compressed data corresponding to memory banks grouped in the merge group; and
an output buffer circuit latching the merged data and outputting the merged data in response to at least one of the plurality of output control signals;
wherein the merge group comprises at least some memory banks included in a same plane group.

2. The memory device of claim 1, wherein each of the one or more plane groups includes one or more merge groups.

3. The memory device of claim 2, wherein the merge group is configured with memory banks physically adjacent to each other.

4. The memory device of claim 3, wherein the merge group includes memory banks included in different memory planes.

5. The memory device of claim 4, wherein, in the merge group, four or more memory banks are grouped.

6. The memory device of claim 1, wherein each of the merge circuits includes:
one or more multiplexing circuits receiving normal data and compressing data from the memory banks, the one or more multiplexing circuits selecting data to be output, based on whether the compression read operation is enabled; and
a latch circuit latching data output from at least some of the multiplexing circuits, the latch circuit outputting the latched data, based on the output control signal.

7. The memory device of claim 6, wherein the one or more multiplexing circuits respectively correspond to a plurality of sub-merge groups included in one merge group, and receive normal data or compressed data, output from memory banks included in a corresponding sub-merge group.

8. The memory device of claim 7, wherein each of the merge circuits includes:
a first multiplexing circuit outputting first compressed data or first normal data, output from memory banks included in a first sub-merge group; and
a second multiplexing circuit outputting second compressed data output from memory banks included in a second sub-merge group and the first compressed data, or second normal data output from the memory banks included in the sub-merge group.

9. The memory device of claim 7, wherein, in the sub-merge group, memory banks which are included in the same merge group and are included in different memory planes are grouped.

10. The memory device of claim 6, further comprising a transmission circuit receiving the merged data from the merge circuits, the transmission circuit transmitting the merged data to the output buffer circuit.

11. The memory device of claim 10, wherein the transmission circuit are connected to the multiplexing circuits respectively through a plurality of channels, selects some of the plurality of channels, based on a plane group select signal indicating a plane group to be selected among the plane groups, and outputs data input through the selected channels to the output buffer circuit.

12. A method of operating a memory device, the method comprising:
generating compressed data obtained by compressing data read from a plurality of memory banks included in each of a plurality of memory planes;
merging compressed data corresponding to memory banks grouped as a merge group in response to at least one of a plurality of output control signals corresponding to at least one of the memory banks; and
outputting the merged data in response to at least one of the plurality of output control signals,
wherein the plurality of memory planes are grouped into memory plane groups, wherein each memory plane group comprises at least two memory planes sharing at least one peripheral circuit, and
wherein, in the merge group, at least some of the memory banks included in the same plane group are grouped.

13. The method of claim 12, wherein the merge group is configured with memory banks physically adjacent to each other.

14. The method of claim 13, wherein each of the one or more plane groups includes one or more merge groups.

15. The method of claim 12, wherein the merging of the compressed data includes:
latching compressed data corresponding to the memory banks included in the merge group; and
outputting the latched data, based on the output control signals.

16. The method of claim 12, wherein the outputting of the merged data includes:
transmitting the merged data to an output buffer circuit; and
outputting merged data latched into the output buffer circuit, based on at least some of the output control signals.

17. The method of claim 16, wherein the transmitting of the merged data to output buffer circuit is performed based on a plane group select signal indicating a plane group to be selected among the plane groups.

18. A storage device comprising:
a memory device; and
a memory controller configured to provide the memory device with a read command for requesting data to be read;
wherein the memory device includes:
a plurality of memory planes, each including a plurality of memory banks;

one or more plane groups, each plane group comprising at least two memory planes sharing at least one peripheral circuit;

a plurality of compressing circuits, wherein each compressing circuit is connected to a corresponding memory bank of the plurality of memory banks and outputs compressed data by compressing data read from the corresponding memory bank of the plurality of memory banks in a compression read operation;

a plurality of merge circuits each merge circuit receiving compressed data and at least one of a plurality of output control signals corresponding to a merge group of a plurality of merge groups, each merge circuit outputting, in response to at least one of the plurality of output control signals, merged data obtained by merging compressed data corresponding to memory banks grouped in the merge group; and an output buffer circuit latching the merged data and outputting the merged data in response to at least one of the plurality of output control signals; and wherein the merge group comprises at least some memory banks included in a same plane group.

19. The storage device of claim 18, wherein, when the read command is a compression read command, data read from the plurality of memory banks are respectively compressed, are merged in a merge group unit, and then are provided to the memory controller.

20. The storage device of claim 18, wherein, when the read command is a normal read command, the data read from the memory banks are provided to the memory controller.

* * * * *